US012327854B2

(12) United States Patent
Asfha

(10) Patent No.: US 12,327,854 B2
(45) Date of Patent: Jun. 10, 2025

(54) APPARATUSES AND METHODS FOR CARBON DIOXIDE CAPTURING AND ELECTRICAL ENERGY PRODUCING SYSTEM

(71) Applicant: Solomon Alema Asfha, Waterloo (CA)

(72) Inventor: Solomon Alema Asfha, Waterloo (CA)

( * ) Notice: Subject to any disclaimer, the term of this patent is extended or adjusted under 35 U.S.C. 154(b) by 782 days.

(21) Appl. No.: 17/329,583

(22) Filed: May 25, 2021

(65) Prior Publication Data

US 2021/0376413 A1 Dec. 2, 2021

Related U.S. Application Data

(60) Provisional application No. 63/032,566, filed on May 30, 2020.

(51) Int. Cl.
*H01M 16/00* (2006.01)
*C25B 1/02* (2006.01)
(Continued)

(52) U.S. Cl.
CPC ............ *H01M 16/003* (2013.01); *C25B 1/02* (2013.01); *C25B 1/04* (2013.01); *C25B 1/34* (2013.01);
(Continued)

(58) Field of Classification Search
CPC ........... H01M 16/003; H01M 8/04007; H01M 8/0656; F01D 15/10; C25B 1/02;
(Continued)

(56) References Cited

U.S. PATENT DOCUMENTS 4,074,708 A 2/1978 Hochmuth
4,128,701 A 12/1978 Maricle
(Continued)

FOREIGN PATENT DOCUMENTS

AU 2010230089 A1 11/2010
CA 2550396 C 10/2005
(Continued)

OTHER PUBLICATIONS

Integration of thermo-chemical water splitting with CO2 direct air capture Casper Bradya, Bingjun Xu, Center for Catalytic Science and Technology, Chemical and Biomolecular Engineering, University of Delaware, Newark, DE 19716; and Mark E. Davisb—Chemical Engineering, California Institute of Technology, Pasadena, CA 91125, Dec. 10, 2019.

(Continued)

*Primary Examiner* — Wayne A Langel

(57) ABSTRACT

The present invention relates to a system, apparatus, and method for the dual-purpose functionality of capturing carbon dioxide (CO2) from atmospheric and flue gas sources and concurrently generating electrical energy. More specifically, this patent application focuses exclusively on the non-ionized hydrogen gas turbine variant of the apparatuses and methods for capturing carbon dioxide and electrical energy generating system invention. The invention embodies an integrated system designed for the efficient capture of CO2 and simultaneous production of clean electricity. To simultaneously generate electric power at maximum efficiency and capture carbon dioxide, the present invention comprises different integrated processes, integrated systems, and techniques. The present system comprises; a non-ionized hydrogen gas turbine system unit, a carbon dioxide capturing system unit, a hybrid solar Hydrogen-Oxygen gas generator system system unit and waste heat recovery system unit. Moreover, the system comprises waste-heat-based carbon dioxide absorption and waste-heat-based regeneration sub-units to power carbon dioxide capturing parts by waste heat. All the systems of units are developed, integrated, hybrid, and co-functionally working to simultaneously enhance both CO2 capture efficiency and electricity generation. Through these integrated processes, systems, and techniques, the invention aims to generate and maxi- (Continued)

mize clean electrical power output while effectively capture CO2 and reducing CO2 emission impacts on the environment with a dual solution approach. The invention further includes various alternative embodiments, and invention versions for versatile application in CO2 capture and energy production fields.

20 Claims, 8 Drawing Sheets

(51) Int. Cl.
| | |
|---|---|
| C25B 1/04 | (2021.01) |
| C25B 1/34 | (2006.01) |
| C25B 1/55 | (2021.01) |
| C25B 15/08 | (2006.01) |
| F01D 15/10 | (2006.01) |
| F02C 6/00 | (2006.01) |
| F02C 7/12 | (2006.01) |
| H01M 8/04 | (2016.01) |
| H01M 8/04007 | (2016.01) |
| H01M 8/06 | (2016.01) |
| H01M 8/0656 | (2016.01) |
| H10N 10/00 | (2023.01) |
| H10N 10/13 | (2023.01) |
| H01M 8/12 | (2016.01) |

(52) U.S. Cl.
CPC ............. *C25B 1/55* (2021.01); *C25B 15/081* (2021.01); *F01D 15/10* (2013.01); *F02C 6/00* (2013.01); *F02C 7/12* (2013.01); *H01M 8/04007* (2013.01); *H01M 8/0656* (2013.01); *H10N 10/00* (2023.02); *H10N 10/13* (2023.02); *F05D 2220/76* (2013.01); *H01M 2008/1293* (2013.01); *H01M 2250/402* (2013.01)

(58) Field of Classification Search
CPC .... C25B 1/04; C25B 1/34; C25B 1/55; C25B 15/081; F02C 7/12; F02C 6/00; H01N 10/00; H01N 10/13
See application file for complete search history.

(56) References Cited

U.S. PATENT DOCUMENTS

| | | | |
|---|---|---|---|
| 5,041,197 A | 10/1991 | Gelb et al. | |
| 7,629,069 B2 | 12/2009 | Finnererty | |
| 8,119,091 B2 | 2/2012 | Keith et al. | |
| 8,516,817 B2 | 8/2013 | Fedorov | |
| 8,568,938 B2 | 10/2013 | Gao et al. | |
| 8,864,974 B2 | 10/2014 | Geurts | |
| 8,894,753 B2 | 11/2014 | Park et al. | |
| 8,984,884 B2 | 3/2015 | Xu | |
| 9,008,188 B2 | 7/2015 | Temelci-Andon | |
| 9,095,813 B2 | 8/2015 | Keith et al. | |
| 9,205,375 B2 | 12/2015 | Jones et al. | |
| 9,227,153 B2 | 1/2016 | Esenberger | |
| 9,410,254 B2 | 8/2016 | Samrgand | |
| 9,437,895 B2 | 10/2016 | Hung | |
| 9,457,313 B2 | 10/2016 | Baker et al. | |
| 9,527,724 B2 | 12/2016 | Wright et al. | |
| 9,616,375 B2 | 3/2017 | Wright et al. | |
| 9,553,321 B2 | 6/2017 | Berlowitz | |
| 9,694,312 B2 | 7/2017 | Park et al. | |
| 9,782,718 B1 | 10/2017 | Baker et al. | |
| 10,322,366 B2 * | 6/2019 | Lee | F23J 15/02 |
| 10,464,014 B2 | 11/2019 | Baker et al. | |
| 10,840,572 B1 * | 11/2020 | Luz | F03D 9/10 |
| 2008/0245672 A1 * | 10/2008 | Little | C25B 15/02 205/555 |
| 2008/0261093 A1 | 10/2008 | Kelly et al. | |
| 2008/0283411 A1 | 11/2008 | Eastman et al. | |
| 2010/0319537 A1 | 12/2010 | Magidoff et al. | |
| 2011/0081561 A1 | 4/2011 | Keshavarrtz et al. | |
| 2011/0167821 A1 | 7/2011 | Baker et al. | |
| 2011/0262328 A1 | 10/2011 | Baker et al. | |
| 2013/0008800 A1 | 1/2013 | Lakkaraju et al. | |
| 2013/0058853 A1 | 3/2013 | Baker et al. | |
| 2014/0271434 A1 | 9/2014 | Buttery | |
| 2015/0298979 A1 | 10/2015 | Dakhil et al. | |
| 2017/0028347 A1 | 2/2017 | Wright et al. | |
| 2018/0133642 A1 | 5/2018 | Baker et al. | |

FOREIGN PATENT DOCUMENTS

| | | | | |
|---|---|---|---|---|
| CA | 2682952 C | | 10/2008 | |
| CN | 106784936 A | * | 5/2017 | ........ H01M 8/04007 |
| DE | 102010035229 A1 | * | 3/2012 | .............. C25B 1/04 |
| EP | 0084815 A2 | * | 8/1983 | .............. C25B 1/04 |
| EP | 1582502 B1 | | 10/2005 | |
| WO | WO-2008151060 A1 | * | 12/2008 | ............. C25B 1/003 |
| WO | WO2011031375 A1 | | 3/2011 | |
| WO | WO2012038330 A2 | | 3/2012 | |
| WO | WO2014080174 A1 | | 5/2014 | |

OTHER PUBLICATIONS

Low Voltage Electrochemical Process for Direct Carbon Dioxide Sequestration, Journal of The Electrochemical Society, 0013-4651/2012/159(5)/B627/2 Ryan J. Gilliam, Bryan K. Boggs, Valentin Decker, Michael A. Kostowskyj, Sasha Gorer, Thomas A. Albrecht—Calera Corporation, Los Gatos, California 95032, USA, Douglas Way—Colorado School of Mines, Golden, Colorado 80401, USA, (2012).

Feasibility of CO2 adsorption by solid adsorbents: a review on low-temperature systems, Int. Jurnal,. Environ. Sci. Technol. DOI 10.1007/s13762-016-1008-1 M. Younas, M. Sohail, L. K. Leong, M. JK Bashir, S. Sumathi1, May 17, 2016.

Preparation of a Low-Cost K2CO3/Al2O3 Sorbent for CO2 Capture at Flue-Gas Operating Conditions, Javad Esmaili and Mohammad Reza Ehsani, Department of Chemical Engineering, Isfahan University of Technology, Isfahan 84156-83111, Iran, (2013).

Experimental study on capture of carbon dioxide and production of sodium bicarbonate from sodium hydroxide Eniviromental Engineering Research Jurnal, http://dx.doi.org/10.4491/eer.2016.042 Jae-Goo Shim, Dong Woog Lee, Ji Hyun Lee, No-Sang Kwak, (2016).

Solubility of Carbon Dioxide in Water and Aqueous Solution Containing Sodium Hydroxide at Temperatures from (293.15 to 393.15) K and Pressure up to 5 MPa: Experimental Measurements Journal of Chemical & Engineering Data • Feb. 2012 Jean-Paul Serin—Université de Pau et des Pays de l'Adour.

\* cited by examiner

Fig 1. Non-Ionized hydrogen gas turbine burning rate regulators and sensors

APPARATUSES AND METHODS FOR CARBON DIOXIDE CAPTURING AND ELECTRICAL ENERGY PRODUCING SYSTEM

RELATED APPLICATIONS

The present application claims the benefit of priority to U.S. patent application No. 63/032,566, filed May 30, 2020, and U.S. patent application Ser. No. 17/329,583, filed May 25, 2021, which is incorporated by reference herein in its entirety.

FIELD OF THE INVENTION

The present invention relates to apparatuses and methods for carbon dioxide capture while simultaneously producing electrical energy. Specifically, the present invention relates to an integrated system for producing clean electrical energy from hydrogen and capturing carbon dioxide from flue gases or air. Moreover, the system co-operates by utilizing renewable hydrogen and exhaust waste heat from the system.

More specifically, this patent application relates exclusively to the non-ionized hydrogen gas turbine variant of the apparatuses and methods for capturing carbon dioxide and clean electrical energy generating system invention.

BACKGROUND OF THE INVENTION

The present invention pertains to a novel carbon dioxide capture system integrated with an electric power generating system. Specifically, this invention targets the capture of carbon dioxide directly from the atmosphere and flue gases, simultaneously generating electric power, offering a duel solution to the pressing environmental issue of excessive carbon dioxide gas emissions.

The Earth faces a significant challenge as billions of metric tons of greenhouse gases are annually discharged into the atmosphere. Among these gases, carbon emissions stand out as the primary pollutant, contributing to a range of environmental issues. The consequences are far-reaching, including the melting of polar icebergs, which not only disrupts ecosystems but also poses threats to human health through rising sea levels, erratic rainfall patterns, and desertification.

The substantial volumes of carbon dioxide released by vehicles and industrial facilities exacerbate these climate disturbances, leading to periodic exacerbations of global climate conditions. This heightened atmospheric carbon dioxide content contributes to rising global temperatures, evidenced by the ongoing melting of polar ice caps and subsequent sea level increases. These shifts in climate dynamics manifest in unusual weather phenomena worldwide.

The phenomenon of global warming is intricately linked to the increased emissions of carbon dioxide. Consequently, efforts to mitigate these emissions have spurred the development of diverse strategies. These strategies encompass the exploration and deployment of alternative energy sources such as hydrogen, solar, and wind energy, aimed at reducing reliance on fossil fuels. Additionally, techniques for capturing and storing carbon dioxide from both the atmosphere and fossil fuel emissions sources have been developed to prevent its release into the atmosphere, thereby addressing the root cause of environmental degradation.

Conventional methods of electricity generation from coal, natural gas, and biomass invariably result in the emission of carbon dioxide. To mitigate these emissions, various carbon capture technologies have been devised, encompassing pre-combustion, post-combustion, oxyfuel combustion, ambient air capture, and biosequestration methods. Each method targets different stages of the combustion process, either capturing carbon dioxide before or after it is released into the atmosphere.

In the per-combustion process, fuel is converted into a gaseous mixture comprising hydrogen and carbon dioxide. The hydrogen component can be isolated and utilized for combustion without producing additional carbon dioxide emissions, while the captured carbon dioxide can be compressed for subsequent transport and storage. Post-combustion techniques involve the separation of carbon dioxide from exhaust gases produced during combustion. This separation can be achieved using various methods, including liquid solvents or other separation techniques. Oxyfuel combustion utilizes oxygen instead of air during the fuel combustion process. This results in exhaust gases predominantly composed of water vapor and carbon dioxide, facilitating the subsequent separation of carbon dioxide from the vapor. Ambient air capture represents a method for directly capturing carbon dioxide from the surrounding atmosphere, generating a concentrated stream suitable for sequestration, utilization, or the production of carbon-based products. Bio-sequestration involves the capture and storage of carbon dioxide from the atmosphere by plants and microorganisms through ongoing or enhanced biological processes.

Moreover, within the realm of carbon dioxide separation techniques, various methods of carbon dioxide capture exist, including membrane separation, liquid separation, solid separation, and cryogenic separation. Membrane separation techniques employ specialized membranes to concentrate carbon dioxide, while liquid separation techniques utilize liquid adsorbents like amines or aqueous ammonia. Solid separation methods employ solid adsorbents such as alkali or alkaline earth metals, whereas cryogenic separation involves the separation of materials at temperatures below their freezing points.

However, the traditional and existing carbon capture technologies often consume substantial amounts of energy from the national grid, leading to increased costs, economic infeasibilities, and hindering widespread adoption. The traditional carbon capture technology consumes megawatt-hours of electric power from the grid. Therefore, there is a pressing need to develop novel and efficient carbon dioxide capture systems. To address this challenge, the present invention introduces a hybrid and integrated system capable of both capturing carbon dioxide and generating electrical energy efficiently from hydrogen. Additionally, the hydrogen is generated from renewable sources, which assures the economic and technical feasibility of the present invention. More specifically, this patent application exclusively introduces the non-ionized hydrogen gas turbine variant of the apparatuses and methods for capturing carbon dioxide and electrical energy generating system invention.

By incorporating innovative design principles, this system autonomously captures carbon dioxide from the atmosphere or flue gases while simultaneously producing electrical energy. This integrated approach not only reduces reliance on external energy sources but also minimizes operational costs associated with carbon capture technologies.

The system simultaneously produces electric power without emitting carbon, providing clean energy for businesses, manufacturers, factories, and/or contributing clean power to the local grid.

Benefits of the Invention

The present invention addresses the pressing need to mitigate carbon dioxide emissions and combat climate change by capturing carbon dioxide from the atmosphere or flue gases while simultaneously generating electrical energy. By doing so, it significantly contributes to reducing climate change, global warming, and air pollution while increasing the availability of energy resources.

The core concept of the invention lies in its integrated system, which combines various sub-inventions, technologies and processes to efficiently capture carbon dioxide and generate clean electric power. This novel integration leads to several benefits:

1. Increased Efficiency: The hybrid nature of the system enhances overall efficiency in both carbon dioxide capture and electric power generation processes.
2. Dual Output: The invention not only captures carbon dioxide but also co-generates electric power and heat energy, thus providing dual benefits from a single system.
3. Cost-Effectiveness: By utilizing internally generated electric power for carbon dioxide capture and leveraging waste heat from other processes, the invention significantly reduces the need for grid energy sources, resulting in a more cost-effective solution.

The philosophy underlying the invention is centered on capturing carbon dioxide emissions while simultaneously generating clean energy. By producing large amounts of electrical power without carbon emissions or air pollution, the invention makes a meaningful contribution to addressing environmental challenges via the dual solutions.

Furthermore, the present invention resolves key challenges associated with traditional carbon capture technologies, particularly the high external energy consumption required for carbon dioxide capture processes. By integrating carbon capture and power generation within a single system, the invention fully replaces the external power consumption for carbon dioxide capture by Exhausted Waste Heat and clean energy. This significant reduction in energy requirements represents a substantial advancement in the field of carbon capture technology.

The invention also addresses the issue of carbon dioxide absorption rate, crucial for efficient carbon capture. Utilizing innovative design elements such as the carbon dioxide reactor core system unit and tree-fashioned carbon dioxide capturing system unit, the invention maximizes the absorption rate by harnessing waste heat from hydrogen gas turbines and carbon dioxide capturing parts. More specifically, this patent application exclusively introduces the system to addresses the issue of carbon dioxide absorption rate, such as the Waste-heat based absorber, crucial for efficient carbon capture. Utilizing innovative design elements such as the Waste-Heat-Based carbon dioxide absorber and waste-heat-based regeneration sub-units of system unit, and the invention maximizes the absorption rate by harnessing waste heat from Non-ionizec hydrogen gas turbines. By circulating exhaust waste heat through these units, the invention elevates the temperature of gases, thereby enhancing the absorption rate and reaction kinetics of carbon dioxide.

Central to the invention's effectiveness is its utilization of exhausted waste heat to replace electrical energy consumption in CO2 separation and regeneration processes. This approach eliminates the need for electric heaters, further reducing energy consumption and enhancing overall efficiency. By repurposing waste heat, the invention not only reduces operational costs but also minimizes environmental impact, aligning with sustainability objectives.

Moreover, the current innovation of the Apparatuses and Methods for Carbon Dioxide Capturing and Electrical Energy Generating System encompasses at seven distinct alternative forms and versions of inventions. These alternative embodiments comprise various sub-inventions, arrangements, and integrations. These alternative embodiments offer various efficiencies and costs. By presenting these alternatives, the invention provides diverse options for end-user industrial applications, catering to different technological capabilities and budgetary constraints. Additionally, the invention ensures economic and technical feasibility by utilizing hydrogen generated from renewable sources. This approach not only aligns with sustainability goals but also enhances the long-term viability of the technology. More specifically, this patent application exclusively introduces the non-ionized hydrogen gas turbine variant of the apparatuses and methods for capturing carbon dioxide and electrical energy generating system invention. This strategic approach aims to enhance the adoption and versatility of the technology on an industrial scale, thereby facilitating the reduction of carbon emissions.

Furthermore, the Tree-Fashioned Carbon Dioxide Capturing System unit is not only unique in the physical structure of the carbon dioxide capturing system, but it is also mainly distinguished from conventional carbon dioxide capturing technologies in terms of internal functionality and operations of the system. The carbon dioxide capturing system unit presents a novel carbon dioxide absorber and regeneration components, which are powered and operate utilizing waste heat energy. These components are specifically innovated to harness waste heat energy, thereby enhancing efficiency and sustainability in the carbon capture process. The "Carbon Dioxide System Unit" encompasses diverse physical configurations, encompassing Tree-Fashioned structures as well as conventional carbon capture structures. To facilitate seamless integration into industrial settings, the system unit incorporates physical structures similar to those found in standard carbon capture plants. Thus, the physical composition of the carbon dioxide-capturing unit is not limited to any singular or binary configuration. All constituent components and elements are tailored to and aligned with the various physical structures and designs, which enhances the applications of the invention at different industrial levels easily. More specifically, this patent application exclusively comprises the conventional physical structure, and all constituent components, sub-parts and elements are tailored to and aligned with it. Moreover, this patent application exclusively presented based on the FIG. 5 version of the invention.

In essence, the present invention serves as a green-energy solution by capturing carbon emissions and producing electrical energy with zero carbon emissions. It operates as a power plant that harnesses water/hydrogen to generate electricity while actively removing CO2 from the environment or flue gases. This pioneering technology not only aids in combating climate change and curbing air pollution but also propels advancements towards a hydrogen-centric pathway and sustainable energy landscape. This environmentally friendly approach underscores the invention's commitment to benefiting humanity and mitigating the impacts of carbon emissions on the planet.

SUMMARY OF THE PRESENT INVENTION

The current invention relates to the apparatuses and methods for capturing carbon dioxide and generating electrical power from the integrated system. The art of the invention creates to capture carbon dioxide from air or flue gases and simultaneously generate electric power. Additionally, the art of the invention creates to increasing the efficiency of electricity production from the system by maximizing thermodynamic efficiencies, and to enhancing the capturing of carbon dioxide systems through the design of an efficient reactor core.

The present invention integrates and combines various techniques, systems, and processes. The description of the present invention focuses on the innovative approach and skills involved in the carbon dioxide capturing and electric power generating system.

In the present invention, various different techniques, systems, and processes are integrated, embedded, and working together. The description of the present invention focuses on the new way of the art and skills of the simultaneously carbon dioxide capturing and electric power generating system.

To enhance clarity, the description of the invention is organized into system units. These units, when combined, integrated, and working together, form and manifest the carbon dioxide capturing and electrical energy producing system invention. Each unit is briefly outlined, detailing processes, apparatuses, arrangements, physical structures, and systems.

Further aspects, embodiments, and features of the invention are elaborated in the following detailed description, along with accompanying drawings. For the purpose of clarity, common or well-known systems, knowledge, parts, and arrangements, processes are not described. Likewise, not every component of the invention's embodiment is described or illustrated unless necessary for understanding by those skilled in the art. Common components or known systems may not be labeled in every figure for clarity purposes.

The present invention comprises different "other alternative systems", for example: the ionized hydrogen gas turbine having another alternative embodiment of a non-ionized hydrogen gas turbine, the carbon dioxide reactor core having another alternative embodiment of the carbon dioxide reactor core, and the super heater having another alternative embodiment of the super heater.

This patent application exclusively presented based on FIG. 5 version of the invention. Moreover, this patent application focuses exclusively on the non-ionized hydrogen gas turbine variant of the apparatuses and methods for capturing carbon dioxide and electrical energy generating system invention.

The present invention of carbon dioxide capturing and electrical energy generating system comprising;
  (a) Non-ionized Hydrogen Gas Turbine Unit: This unit is pivotal for generating electric power by harnessing hydrogen and oxygen gases. Its design emphasizes efficiency in converting chemical energy into electrical energy.
  (b) Carbon dioxide capturing system unit; to extracting and capturing carbon dioxide from the atmosphere, or flue gases. To operate the system unit, it utilizes clean electric power and waste heat generated by the system.
  (c) The hybrid solar hydrogen-oxygen gas generator system unit is; This unit ensures the uninterrupted production of hydrogen and oxygen gases, critical inputs for the system's energy generation components. It highlights the system's use of renewable energy sources to sustain its operations.
  (d) Waste Recovery System Unit: This unit captures and utilizes waste heat from various components of the system, including the non-ionized hydrogen gas turbine, and carbon dioxide sub-parts. By driving an additional steam turbine, it further enhances the system's electrical output, showcasing the invention's commitment to energy efficiency and sustainability.

The carbon dioxide capturing and electrical energy producing system wherein a non-hydrogen gas turbine unit, solar hybrid hydrogen-oxygen gas generator system unit, and waste heat recovery system units are physically or electrically or mechanically coupled and integrated each other. The hybrid and integration of a variety units of inventions create to achieve the objective of capturing carbon dioxide and generating electrical power from the system to manifest the invention.

The descriptions of the current processes, integrations, hybrids, and methods, are exemplary and non-limiting. Certain Substitutions, modifications, and/or rearrangements over the present invention are disclosed by the owner of the invention.

BRIEF DESCRIPTION OF THE DRAWINGS

The present patent application comprises a series of drawings that serve to elucidate the underlying technology and advancements in the field. In this specific patent application, the selected figure numbers have been subsequently arranged, and, as a result, may different fig number from those assigned to the corresponding drawings in the original application submitted in May 2021. However changing representation numbers creates significant complexities and difficulties. Therefore, in order to enhance clarity, maintain consistency and coherence with the original patent application filed in May 2021, this application adopts the same element representation numbers. Consequently, the sequence of element representation numbers may not strictly adhere to a consecutive order within this application.

The drawings included in this application are as follows:

FIG. 5 is the updated drawing from the previously submitted FIG. 24 and this figure is specifically for this patent application from the previously filed patent application. This figure particularly emphasizes the innovative aspects of the system, these features contribute significantly to the overall efficiency and performance of the system.

DETAILED DESCRIPTIONS OF THE INVENTION

The present invention of "Apparatuses and Methods for Carbon Dioxide Capturing and Electrical Energy Producing System" pertains to apparatuses and methods for the capture of carbon dioxide and the generation of electrical power. The integrated system comprises several unit systems, each contributing to the overall functionality, and comprising the following interconnected units:

(a) Non-ionized Hydrogen Gas Turbine Unit: This unit is pivotal for generating electric power by harnessing hydrogen and oxygen gases. Its design emphasizes efficiency in converting chemical energy into electrical energy.

(b) Carbon dioxide capturing system unit; to extracting and capturing carbon dioxide from the atmosphere, or flue gases. To operate the system unit, it utilizes clean electric power and waste heat generated by the system.

(c) The hybrid solar hydrogen-oxygen gas generator system unit is; This unit ensures the uninterrupted production of hydrogen and oxygen gases, critical inputs for the system's energy generation components. It highlights the system's use of renewable energy sources to sustain its operations.

(d) Waste Recovery System Unit: This unit captures and utilizes waste heat from various components of the system, including the non-ionized hydrogen gas turbine, and carbon dioxide sub-parts. By driving an additional steam turbine, it further enhances the system's electrical output, showcasing the invention's commitment to energy efficiency and sustainability.

A. Non-Ionized Hydrogen Gas Turbine Unit

Figure 1:
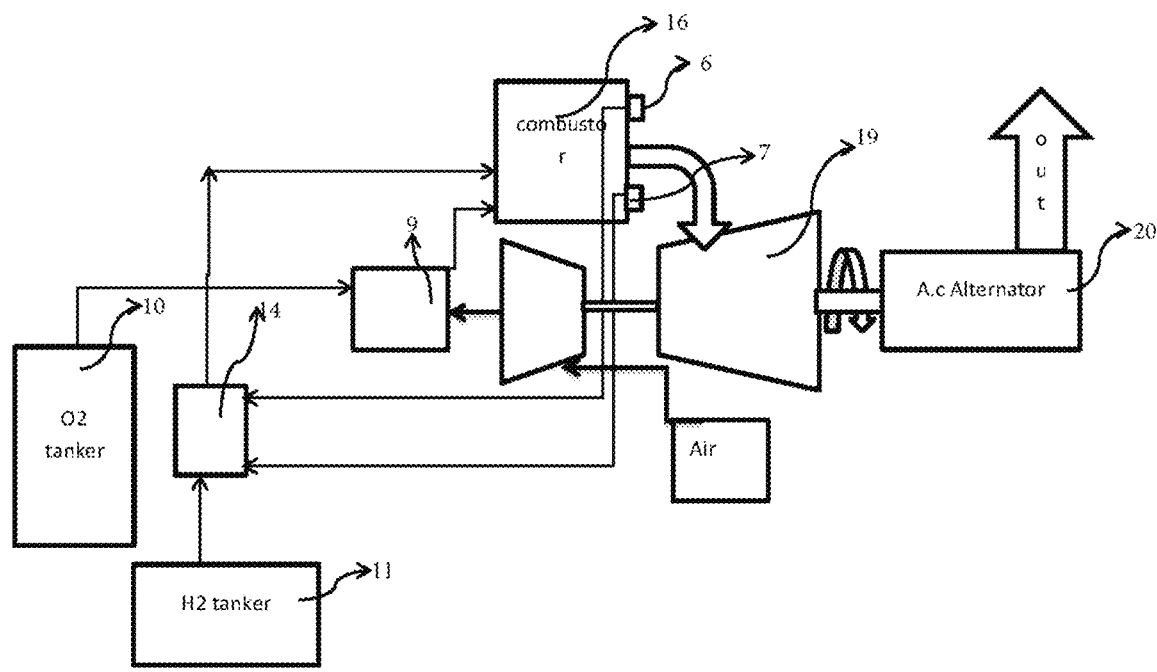
FIG. 1 presents an illustration of a non-ionized hydrogen gas turbine system unit, complete with hydrogen burning rate regulators and sensors.

The present invention incorporates a carbon dioxide capturing and electrical energy-producing system, featuring the non-ionized hydrogen gas turbine unit depicted in FIG. 1. This unit is designed to generate electrical power from hydrogen, utilizing a system that comprises:

1. Hydrogen and Oxygen Gas Sources (11, 10): The unit integrates sources of hydrogen and oxygen gases to initiate the power generation process.
2. Automatic Hydrogen Gas Regulator (13): This component ensures precise control over the flow of hydrogen gas into the system.
3. Oxygen and Ambient Gases Mixing Regulator (9): Regulates the mixing of oxygen and ambient gases to optimize combustion efficiency.
4. Temperature Sensor (6) and Pressure Sensor (7): These sensors provide real-time data on temperature and pressure within the system, enabling dynamic adjustments for optimal performance.
5. Compressor (18) and Turbine (19): These components facilitate the compression and expansion processes essential for power generation.
6. Combustor (16): The combustor is where hydrogen and oxygen gases are ignited to generate high-temperature, pressurized gas required for power production.
7. Electric Generator (20): Converts mechanical energy from the turbine into electrical power for utilization.

In operation, hydrogen and oxygen gases are introduced into the combustor and ignited directly. The combustion process results in the generation of high-temperature, pressurized gas, driving the turbine for electricity production.

Hydrogen utilized in this process can be sourced from various outlets, including brine electrolysis and hydrogen-oxygen generators powered by solar and other renewable sources. Additionally, the non-ionized hydrogen gas turbine unit is designed to accommodate hydrogen from various renewable sources, and the present invention making it easily adaptable for commercial power generation and industrial-scale implementation at different size at different location.

The combustion-generated gas 46 is directly fed into the gas turbine 19, resulting in an unprecedented high conversion efficiency of electricity. The resulting electric power generated is utilized for both the carbon dioxide capturing process and commercial purposes. The non-ionized hydrogen gas turbine unit is seamlessly integrated and collaborates with other unit systems within the invention. This integration serves to boost efficiency, produce additional power, and harness the exhaust waste heat as an energy source for the carbon dioxide capturing system unit.

As illustrated in FIG. 1, the hydrogen combustion gas turbine system encompasses hydrogen and oxygen gas sources, a combustor, high-temperature gas exhaust, a turbine, and an electric generator. The direct burning of hydrogen and oxygen gases in the combustion chamber enables efficient electricity generation.

Moreover, the present invention incorporates the non-ionized hydrogen gas turbine system unit, which consists of several sub-units, functions, and processes aimed at optimizing function, performance and efficiency.

Hydrogen, Oxygen, and Non-Combustible Gas Injection Process:

As illustrated in FIG. 1 the non-ionized hydrogen gas turbine system unit integrates a method and process for injecting and intermixing non-combustible gas (non-burnable ambient gas) with the burnable gas mixture (hydrogen and oxygen gases). This injection and intermixing process serve to alter the burn rate of hydrogen in the combustion chamber. Specifically, by increasing the volume of non-combustible gas 17 through the gas mixing regulator 9, the burn rate of the gas mixture comprising hydrogen and oxygen gases can be diminished or decreased.

This mechanism ensures that the burn rate of hydrogen remains constant through precise adjustment of the gas mixing regulator, maintaining optimal combustion conditions. Moreover, the introduction of non-burnable gas serves to restrict the speed of hydrogen and oxygen atom combustion within the chamber. This gas restricting process is adaptable to various types or combinations of burnable gases or gas mixtures, enhancing versatility and applicability. Furthermore, this mechanism serves an additional function of safety measure and this safety measure helps mitigate the risk of rapid combustion events and enhances control over the combustion process.

The primary function of this injection process is to alter the burn rate of hydrogen during combustion. By adjusting the volume of non-combustible gas, the burn rate of the hydrogen and oxygen gas mixture can be controlled and optimized for maximum efficiency. This mechanism ensures consistent and stable combustion, leading to improved energy release and overall system performance.

Detailed Function of the Sub-Unit: The gas mixing regulator plays a crucial role in the hydrogen, oxygen, and non-combustible gas injection process. It precisely controls the flow rate and volume of non-combustible gas injected into the combustion chamber, allowing for fine-tuning of the burn rate of the hydrogen and oxygen gas mixture.

Through dynamic adjustment of the gas mixing regulator, the system can adapt to varying operating conditions and power demand requirements, optimizing combustion efficiency and stability. This ensures reliable and consistent power generation while minimizing emissions and environmental impact.

In summary, the detailed function of the sub-unit within the non-ionized hydrogen gas turbine system unit lies in its ability to regulate the combustion process effectively, achieving optimal performance and efficiency in carbon dioxide capture and electrical power generation applications.

The Gas Mixing Regulator and Flame Temperature Adjuster;

The non-ionized hydrogen gas turbine system unit, as illustrated in FIG. 1, comprises several interconnected sub-units that work in harmony to regulate the gas mixing and flame temperature adjustment processes.

The gas mixing regulator and flame temperature adjuster are critical components of both the non-ionized and ionized hydrogen gas turbine system units. These components facilitate the regulation of the hydrogen gas burn-rate, which can be adjusted within a range of 325 cm/sec to 42 cm/sec, and the combustion temperature, which can be adjusted from 1000 to 5000 degrees Centigrade. The combustion temperature is fixed at an appropriate level for the combustion turbine 16, ensuring that the gas flame-temperature remains constant with the constant gas flow-rate of the combustion gases.

A temperature sensor 7 is strategically positioned within the combustion chamber, and a pressure sensor 6 is mounted within the gas turbine. These sensors provide continuous feedback to the automatic hydrogen gas flow controller 14, which in turn controls the burning rate of the hydrogen. This continuous feedback and control process, known as "The Gas Combustion Stabilization Process," ensures a uniform combustion temperature. The integration of the automatic hydrogen gas flow controller 14, temperature sensor 7, and pressure sensor 6 forms the regulating system, as depicted in FIG. 1.

The automatic hydrogen gas flow controller 14 regulates the flow rate of hydrogen gas, controlling the burning rate and output power of the hydrogen gas turbine. The Gas Combustion Stabilization Process dynamically adjusts the burn-rate of the hydrogen gases to achieve the desired gas-flame temperature. An increase in the amount of hydrogen flowing into the combustion chamber results in an increase in the burning-rate, combustion temperature, and gas turbine pressure. The amount of hydrogen gas flow is directly proportional to the burning-rate. This relationship between hydrogen flow, burn rate, temperature, and pressure ensures proportional control and efficient operation of the system.

In an alternative embodiment, the burning-rate of hydrogen in the combustion is controlled by the Gas-Mixing Regulator 9 system, which mixes oxygen gas 10 with non-combustion ambient gases. The Gas-Mixing Regulator 9 is fitted at the outer top of the oxygen gas and ambient gas cylinders. This regulator mixes non-combustion ambient gases with the desired amount of oxygen gases, and the resulting mixed gases are supplied to the combustion chamber. The mixed gases then burn with hydrogen gas in the combustion.

The Gas-Mixing Regulator 9 operates in conjunction with the temperature sensor, pressure sensor, and automatic hydrogen gas regulator. Based on continuous feedback from these components, the Gas-Mixing Regulator 9 mixes the desired amount of oxygen 10 with non-combustible ambient gases. A higher amount of oxygen in the mixed gas results in an increased burning-rate. The amount of oxygen in the mixed gas is directly proportional to the burning-rate. This system provides a uniform gas-mixture to combustion 16, playing a crucial role in the regulation of the hydrogen burning-rate.

The apparatuses and methods illustrated on the non-ionized hydrogen gas turbine system unit is such that it maintains a stable and efficient combustion process. The Gas Combustion Stabilization Process ensures that the combustion temperature remains constant, thereby preventing potential damage to the turbine and ensuring optimal performance.

The automatic hydrogen gas flow controller 14, in response to the feedback from the temperature sensor 7 and pressure sensor 6, adjusts the flow rate of hydrogen gas to maintain the desired combustion temperature. This adjustment is made in real-time, allowing the system to respond quickly to any changes in operating conditions.

In the alternative embodiment, the Gas-Mixing Regulator 9 system provides precise control over the mixing of oxygen gas 10 with non-combustion ambient gases. This control allows for the regulation of the burning-rate of hydrogen, thereby influencing the combustion temperature and pressure in the gas turbine. The Gas-Mixing Regulator 9 system is particularly advantageous in applications where precise control over the combustion process is required.

The integration of the automatic hydrogen gas flow controller 14, temperature sensor 7, pressure sensor 6, and Gas-Mixing Regulator 9 system results in a stable functionality, highly efficient and reliable non-ionized hydrogen gas turbine system unit. This unit is capable of operating over a wide range of conditions, making it suitable for use in a variety of applications.

In operation, the non-ionized hydrogen gas turbine system unit provides a stable and efficient source of power. The Gas Combustion Stabilization Process ensures that the combustion process is maintained at optimal conditions, while the automatic hydrogen gas flow controller 14 and Gas-Mixing Regulator 9 system provide precise control over the combustion process. The result is a highly efficient and reliable power source that can be used in a wide range of applications.

Moreover, the efficient operation of the non-ionized hydrogen gas turbine unit relies on several technical intricacies; and the non-ionized hydrogen gas turbine unit further comprising the technical details and considerations;

1. Combustion Process Optimization: Through precise control of hydrogen and oxygen gas flow rates and the mixture composition, the combustion process is optimized to ensure maximum energy release and minimal waste.
2. Heat Recovery Systems: The integrated heat recovery systems are designed to capture surplus heat generated during the combustion process. By harnessing this excess heat, the overall system efficiency is significantly enhanced. This captured heat serves multiple purposes, including the preheating of incoming gases and the generation of steam for supplementary power generation. Moreover, the exhausted waste heat plays a crucial role in powering the carbon dioxide absorption and regeneration parts of the carbon dioxide capturing system unit FIG. 5 of 38 and FIG. 6. This innovative approach replaces electric heaters with waste heat, thereby maximizing energy utilization and minimizing reliance on external power sources.

3. Turbocharger Design: The design of the compressor and turbine components is optimized to minimize energy losses and maximize power output. Advanced aerodynamic principles and materials selection contribute to efficient gas compression and expansion.
4. Sensor Feedback Control: Real-time feedback from temperature and pressure sensors enables the system to dynamically adjust combustion parameters, ensuring stable and efficient operation across varying operating conditions.
5. Safety Measures: Comprehensive safety measures, including flame detection systems, pressure relief valves, and emergency shutdown mechanisms, are implemented to safeguard against potential hazards associated with hydrogen combustion.
6. Material Selection: High-temperature-resistant materials are utilized throughout the system to withstand the extreme operating conditions encountered during hydrogen combustion, ensuring long-term reliability and durability.
7. System Integration: The non-ionized hydrogen gas turbine unit is seamlessly integrated into the overall carbon dioxide capturing and electrical energy-producing system, allowing for efficient coordination and operation alongside other system components.
8. Control System: An advanced control system oversees the operation of the non-ionized hydrogen gas turbine unit, coordinating the interaction between various sub-systems to optimize overall system performance while maintaining safe operating conditions.

Therefore, non-ionized hydrogen gas turbine unit FIG. 1 incorporate these technical details and considerations, and the non-ionized hydrogen gas turbine unit achieves exceptional efficiency and reliability in generating electrical power from hydrogen, thereby contributing to the overall effectiveness of the carbon dioxide capturing and energy-producing system.

The non-ionized hydrogen gas turbine unit employs hydrogen and oxygen gases directly to produce electric power through a generator. As depicted in FIG. 1, the method for generating power with the non-ionized hydrogen gas turbine encompasses various steps and processes, primarily comprising at least the following main processes:— i. Producing hydrogen and oxygen gases using renewable sources: through the utilization of renewable sources, and sodium hydroxide or alkali base. Subsequently, sodium hydroxide and renewable energy is employed to generate hydrogen (11) and oxygen (10) gases from the hydrogen-oxygen generator (24).

Alternatively, the system utilizes green hydrogen sourced externally from renewable energy sources (Such as solar, wind, hydro, ocean wave energy) to operate the carbon dioxide capturing and electrical energy-producing system invention.

ii. Regulating hydrogen, oxygen and non-non-combustion ambient gases: the regulation of hydrogen, oxygen, and non-combustion ambient gases is essential for maintaining optimal combustion conditions within the system. Precise control over the composition and flow rates of these gases ensures efficient and stable operation.

iii. Combustion process: Hydrogen gas is burned in a mixture of oxygen and ambient gases within the combustion chamber. This combustion process generates a source of super high-temperature gas (46), which serves as the primary driving force for one or more gas turbines. The super high-temperature gas is utilized to generate electrical power or drive a shaft for various useful applications.

Operational Details: The combustion of hydrogen gas in the presence of oxygen and ambient gases results in the release of immense heat energy. This energy is harnessed to produce a stream of super high-temperature gas, which drives the hydrogen gas turbines within the system. The rotational motion generated by the turbines is then converted into electrical power by the generator, facilitating the generation of electricity.

The non-ionized hydrogen gas turbine system unit serves as a dual-purpose system, generating electric power and waste heat. The electric power generated by this system is utilized for both external electric energy supplies and to power the internal systems of the carbon dioxide capturing process. The exhaust waste heat utilizes to operate the other unites and parts of the carbon dioxide capturing and electrical energy production system invention.

As illustrated in FIG. 1, the method of generating power from the non-ionized hydrogen gas turbine system unit is intricately linked with the integration of other units within the carbon dioxide capturing and electrical energy production system. The non-ionized hydrogen gas turbine system unit is co-functioning and integrated with various system units, including:

i. Hybrid Solar Hydrogen-Oxygen gas Generator System Unit (21 and 24):
This unit is responsible for producing hydrogen and oxygen gases essential for the operation of non-ionized hydrogen combustion gas turbine system unit.

ii. Waste Heat Recovery System Unit (39): Designed to convert exhaust waste heat from carbon dioxide capturing system sub-parts and non-ionized hydrogen gas turbine system units into usable energy, enhancing overall system efficiency.

iii. Carbon Dioxide Capturing System Unit (FIG. 5 of 38): The carbon dioxide absorber and regeneration part of this unit leverage the exhausted waste heat released from non-ionized hydrogen gas turbine system units to enhance carbon dioxide capture from the atmosphere or flue gases.

Operational Dynamics: The Non-ionized hydrogen gas turbine system unit operates synergistically with these integrated units to manifest the carbon dioxide capturing and electrical energy production system invention. The units work synergistically to capture carbon dioxide and simultaneously generate clean electric power, and one unit of the system is dependent on another unit of the system. By harnessing waste heat and optimizing resource utilization, the system achieves enhanced efficiency in both electricity generation and carbon dioxide capture, paving the way for sustainable energy solutions.

B. Hybrid Solar Hydrogen-Oxygen Gas Generator System Unit

Figure 2:
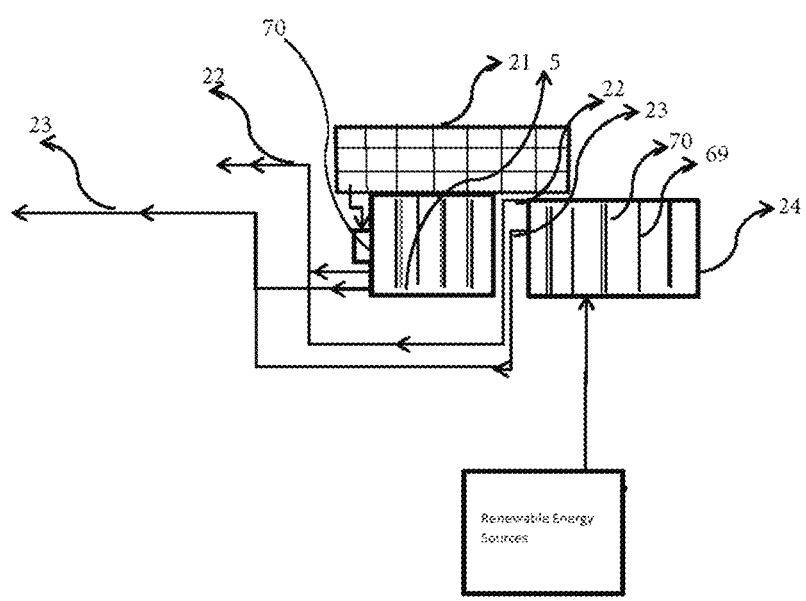
FIG. 2 provides a depiction of a hybrid solar hydrogen-oxygen gas generator unit.

Within the framework of the "Co2 capture and electric power generation system invention" the system comprises a essential unit is the "Hybrid Solar Hydrogen-Oxygen Gas Generator System Unit," as illustrated in FIG. 2. This unit encompasses the renewable energy-based hydrogen-oxygen generator (24).

The primary objective of the hybrid solar hydrogen-oxygen gas generator system unit is twofold: to sustainably produce hydrogen and oxygen gases continuously from renewable energy sources and to facilitate the supply of hydrogen gas to the CO2 capture and electric power generation system. The present innovation encompasses a hydrogen-oxygen gas generating unit wherein electrolyser cells (24) are exclusively powered by renewable energy sources, comprising solar, wind, wave (ocean energy), and/ or hydroelectric power (21), ensuring an uninterrupted production of hydrogen and oxygen gases.

The core functionality of the "Hybrid Solar Hydrogen-Oxygen Gas Generator System" is to generate hydrogen from renewable sources and to energize the entirety of the "Co2 Capture and Electrical Energy Generation System." Renewable energy (21) propels the hydrogen-oxygen gas generator (24) to produce hydrogen and oxygen gases, subsequently stored in dedicated hydrogen tanks (11) and oxygen gas tanks (10) respectively.

They harness green hydrogen as the primary energy source for the operation and functionality of pairs of integral components, including the non-ionized hydrogen gas turbine unit.

The "Hybrid Solar Hydrogen-Oxygen Gas Generator System," depicted in FIGS. 2, utilizes externally sourced sodium hydroxide base or other alkali bases to generate hydrogen and oxygen gases. This innovative system harnesses renewable energy to split water molecules via electrolysis, yielding hydrogen at cathode 69 and oxygen at anode 70, as demonstrated in FIG. 2. The system at least comprising solar energy source 21 or any other renewable sources, cathode 69, anode 70 electrodes, and electrolytic alkali chemicals such as sodium hydroxide 31 or the system alternatively uses potassium hydroxide or other alkali base. Additionally, the system seamlessly integrates with other units of the "CO2 Capturing and Electrical Energy Producing System."

The hydrogen and oxygen gases are produced from the "Hybrid Solar Hydrogen-Oxygen Gas Generator System" depicted in FIG. 2. Subsequently, hydrogen and oxygen gases are stored in hydrogen tanks 11 and oxygen tanks 10, respectively, and utilized to power non-ionized hydrogen gas turbine system 19, for co-generating electric power and heat energy. Furthermore, hydrogen gas is also utilized to power and operate other system components in the system, such as the waste heat recovery system unit.

In certain embodiments of the invention, the Hybrid Solar Hydrogen-Oxygen Gas Generator System seamlessly integrates with other components of the CO2 capturing and electrical energy producing system, such as:—
  i. Non-ionized Hydrogen Gas Turbine Unit: Utilizing hydrogen and oxygen gases produced from the Hybrid Solar Hydrogen-Oxygen Gas Generator System depicted in FIGS. 2, the system generates electrical power and heat energy through the non-ionized hydrogen gas turbine unit.
  ii. Waste Heat Recovery System Unit: This system produces pressurized steam from diverse waste heat sources. Moreover, it employs hydrogen within the superheater sub-units to elevate steam pressure to its maximum, propelling a sizable steam turbine for electric power generation.

In another embodiment of the Hybrid Solar Hydrogen-Oxygen Gas Generator System, potassium hydroxide and other alkali bases are utilized. Additionally, as an alternative configuration, the Hybrid Solar Hydrogen-Oxygen Gas Generator System unit can be located at separate sites from the overall system, with hydrogen being transported to the "Carbon Dioxide Capturing and Electric Power Generation" plant. Furthermore, the system can alternatively incorporate external hydrogen fuel sources generated from various origins, from renewable sources. Alternatively, the hydrogen from various sources can be directly transported to the "Carbon Dioxide Capturing and Electric Power Generation" plant. This range of alternative hydrogen sources enhances the technology's versatility and adaptability for industrial-scale applications.

The hybrid solar hydrogen-oxygen gas generator system unit encompasses the following processes and procedures:
  i. Harnessing electrical energy from renewable sources such as solar, wind, geothermal, wave (ocean) energy, and hydroelectric power to fuel the hydrogen-oxygen gas generator cells.
  ii. Generating hydrogen 22 and oxygen 23 gases from electrolysis alkali bases within the hydrogen-oxygen generator sub-unit. As mentioned above, alternatively, hydrogen can be produced at separate locations from renewable energy sources and then transported to the "Carbon Dioxide Capturing and Electric Power Generation" facility. Moreover, the produced oxygen gas from the hydrogen oxygen gas generator sub-unit also utilized for other industrial applications.
  iii. Accumulating energy in the form of hydrogen 11 for storage purposes. Automatously and precisely provide hydrogen gases to the system based on the real time feedback from the system.
  iv. Directing hydrogen and oxygen gases/ambient air to the Non-ionized hydrogen gas turbine system unit and to the super-heater unit system units to operate the entire "Carbon Dioxide Capturing and Electrical energy producing system unit", co-generate electric power and heat energy from the system, and simultaneously capture carbon dioxide.
  v. Powering the carbon dioxide-capturing system unit with "Waste Heat and green energy".
  vi. Storing energy and/or integrating the major surplus generated green electric power into the grid or utilizing it for commercial applications.

The hybrid solar hydrogen-oxygen gas generator system unit operates synergistically with these integrated units to manifest the carbon dioxide capturing and electrical energy production system invention. By producing uninterrupted hydrogen gas from the system, the carbon dioxide-capturing and electrical energy-producing system invention operates and effectively achieves enhanced efficiency in both electricity generation and carbon dioxide capture, paving the way for sustainable energy solutions.

C. The Carbon Dioxide Capturing System Unit

The embodiment of the present invention introduces a Carbon Dioxide Capturing System Unit (FIG. 5 of 38 and FIG. 6), designed to efficiently extract and capture carbon dioxide from either atmospheric or flue gases. The structural configuration of the carbon dioxide capturing system unit in this specific patent application has a conventional physical structure that is similar to the physical structure of conventional carbon capture technologies.

The objectives of this innovative Carbon Dioxide Capturing System Unit are as follows:
  i. Utilization of Waste Heat: The process of carbon dioxide absorption and separation, along with the regeneration step, harnesses waste heat derived from the Non-ionized Hydrogen Gas Turbine Unit.
  ii. Design Elegance and Cost-Effectiveness: The unit is engineered to be unique, cost-effective, easily deployable, and highly efficient.
  iii. Reduction of External Power Consumption: Integration with other units within the system, such as the Non-ionized Hydrogen Gas Turbine Unit (19), and Waste Heat Recovery System Units (39), ensures sufficient internal generation of electric power. Consequently, the Carbon Capture System Unit (FIG. 5 of 38 and FIG. 6) is fully powered by internally generated electricity and waste heat from the system, effectively reducing the dependence on external energy (grid) sources typically associated with carbon capture technologies.

Figure 5:
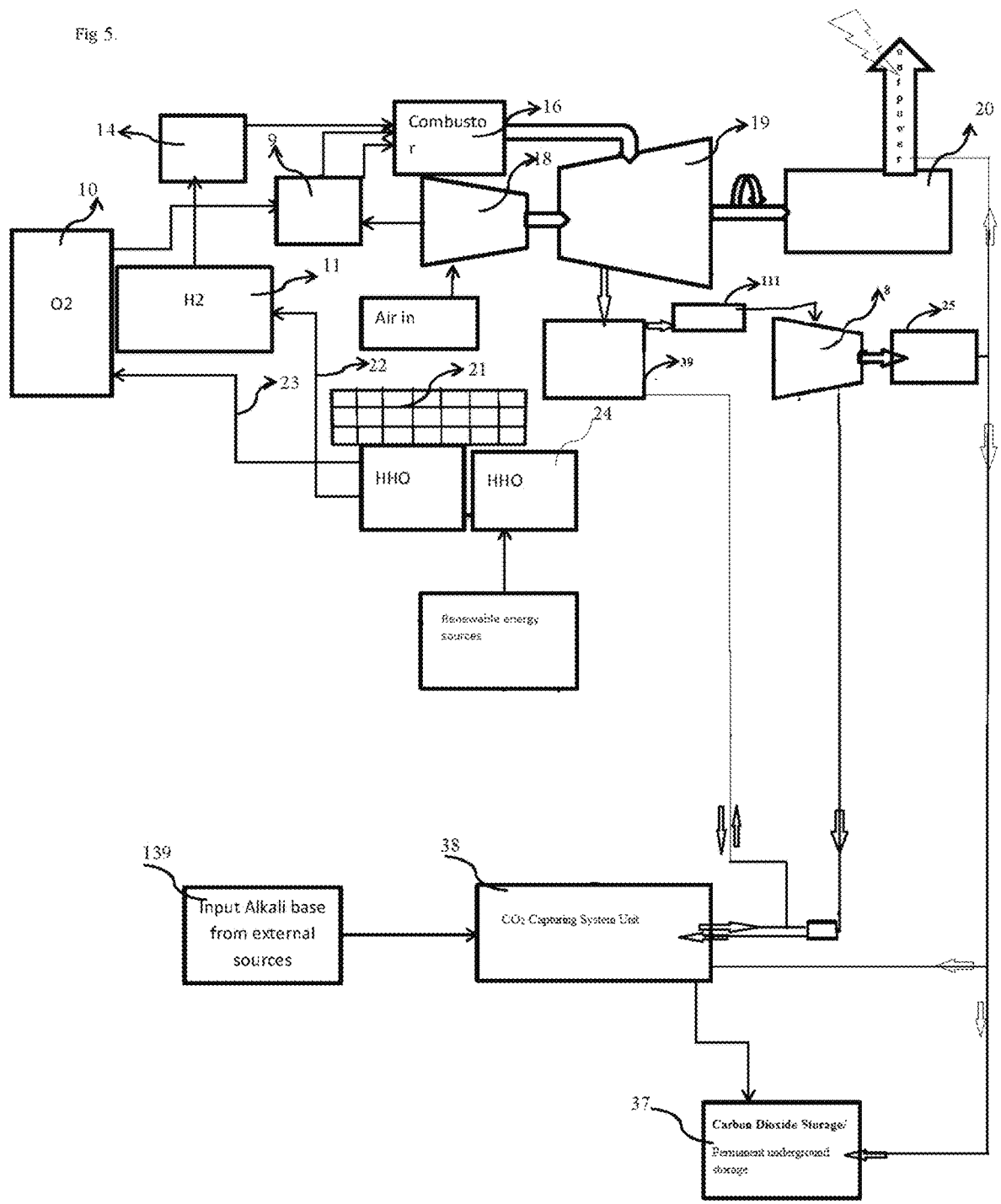
FIG. 5 reveals the carbon dioxide capturing and electrical energy producing system, which represents the chosen embodiment for the this patent application submitted herein. In addition.
Figure 8:
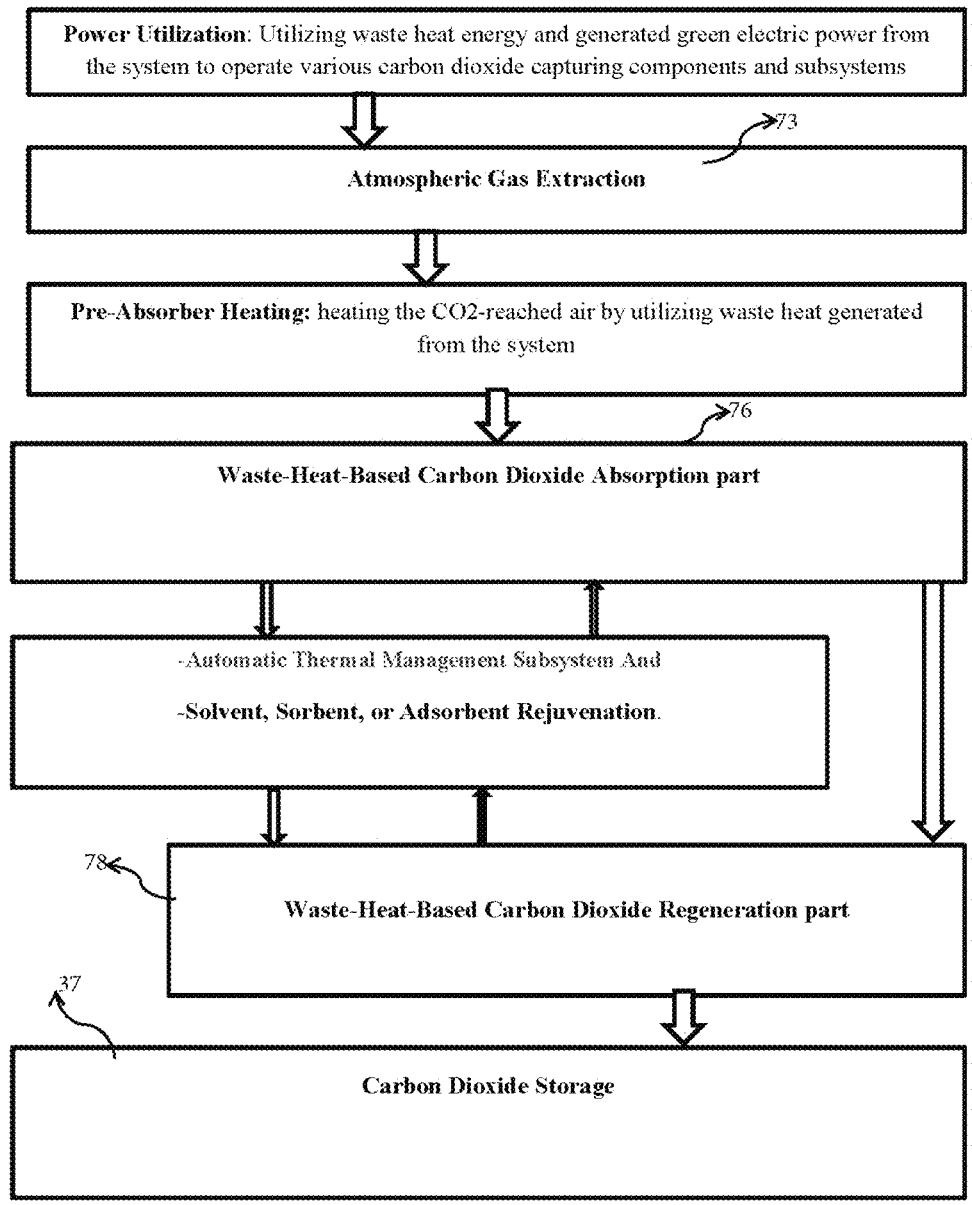
FIG. 8 displays the carbon dioxide capturing system from air.

The Carbon Dioxide Capturing System Unit comprises:

i. Exhausted Waste Heat-Based Heater: As depicted in FIG. 8, ambient gases containing carbon dioxide are drawn in through fans (73) and undergo the absorption or separation process. The carbon dioxide absorbing/separating step (76) and the subsequent regeneration step (78) utilize waste heat recovered from the Hydrogen Gas Turbine Unit (19), and Waste Heat Recovery Unit (39), as illustrated in FIG. 5 and FIG. 8. The heater is designed with a heat exchanger to efficiently transfer the waste heat to the incoming gases. The waste heat temperature is used to maximise the efficiency of both the carbon dioxide absorption and regeneration processes.

The heater is designed with a heat exchanger to efficiently transfer the waste heat to the incoming gases. The waste heat temperature is used to maximize the efficiency of both the carbon dioxide absorption and regeneration processes.

ii. Carbon Dioxide Solvents/Sorbents/Adsorbents (76): The system employs various methods, such as solid absorbents, adsorbents, and solvents (FIG. 8 of 76), to absorb and capture carbon dioxide.

iii. Carbon Dioxide Absorber Part (76): illustrated in FIG. 6 and FIG. 8, ambient gases containing carbon dioxide are drawn in through fans (73) and then heated to the appropriate temperature for the absorption or separation process. The heated gases are then exposed to the solvents/sorbents/adsorbents (76), where carbon dioxide is absorbed. The efficiency of carbon dioxide absorption depends on both the temperature of the gases and the absorbent materials. To optimize carbon dioxide capture efficiency, waste heat is utilized to increase absorption rates in the solvents/sorbents/adsorbents. The absorber part is designed with a packed bed or a plate column to maximize the contact between the gases and the absorbent materials.

iv. Regeneration Part (78): Once saturated with carbon dioxide, the solvents/sorbents/adsorbents (76) flow into the regeneration part (78) where they are heated. This process releases the captured carbon dioxide gas from the solvents/sorbents/adsorbents, restoring them for reuse. The produced solvents/sorbents/adsorbents are cooled using a cooler (84) located at the base of the tree structure. Subsequently, the cooled solvents/sorbents/adsorbents are returned for reuse in the carbon dioxide absorbing/separating part (76), while the captured carbon dioxide gas is pumped, compressed, and stored in a carbon dioxide tanker (37). The regeneration part is designed with a desorption column and a condenser to efficiently release and collect the carbon dioxide gas.

v. Carbon Dioxide Compressor: Utilized for compressing and storing carbon dioxide in the tanker (37). The compressor is designed to handle high pressures and is equipped with a cooling system to manage the heat generated during compression. The compressor also includes a safety valve to prevent overpressure situations.

vi. Carbon Dioxide Storage Tanker (37): The tanker is designed to store the compressed carbon dioxide safely. It is made of materials that can withstand the high pressures and are resistant to corrosion. The tanker is equipped with a pressure relief valve and a level indicator to monitor the level of carbon dioxide.

The sub-unit for the regeneration of carbon dioxide, utilizing waste heat, is meticulously designed to receive carbon dioxide-saturated solvents/sorbents/adsorbents from the Carbon Dioxide Absorber sub-unit. This regeneration sub-unit facilitates the heating of saturated solvents/sorbents/adsorbents, thereby liberating carbon dioxide. The unsaturated solvents/sorbents/adsorbents are then transported to the cooling section of the machine for subsequent reuse. The waste heat-based carbon dioxide regeneration sub-unit encompasses a variety of heat configuration types, including but not limited to Fluidized Bed Heater, Rotary Kiln Heater, Belt Conveyor Heater, Screw Conveyor Heater, Fluid Bed Dryer Heater, or Indirect Heat Exchanger Heater. These diverse types of waste heat-based carbon dioxide regeneration heaters have been innovatively modified to operate in harmony with the carbon dioxide absorber component, the hydrogen gas turbine unit systems, and the waste heat recovery unit system. Furthermore, the waste heat-based carbon dioxide absorber incorporates a heat transfer mechanism, such as a Shell and Tube Heat Exchanger, to elevate the temperature of the carbon dioxide and increase the absorption rate.

Moreover, the waste heat-based carbon dioxide absorbing and regenerating system utilizes and operates by waste heat as its primary energy source and at least comprises, an Automatic Thermal Management Subsystem.

An Automatic Thermal Management Subsystem; the automatic thermal management subsystem configured to monitor and control the temperature within the system, and at least comprising temperature sensors, pressure sensors, and control valves that regulate the flow of waste heat to maintain optimal operating conditions for the absorption and regeneration processes, and automatically adjust the temperature levels for the carbon dioxide absorbing and regenerating sections;

wherein the automatic thermal management subsystem synergistically works with the waste heat recovery system unit and non-ionized hydrogen gas turbine system unit, facilitating the carbon dioxide absorbing and regenerating sections by channeling waste heat through a heat exchanger system to enable efficient heat transfer.

Furthermore, the novel Waste Heat-Powered Carbon Dioxide Capturing Unit system employs and integrates various carbon dioxide absorption techniques, including solvents, sorbents, membranes, and cryogenics. These techniques are harnessed within the waste heat-based absorption and regeneration sub-parts of the carbon dioxide capture unit to achieve efficient carbon dioxide capture from diverse sources, such as atmospheric or flue gases.

Within the absorption component, waste heat is utilized to facilitate the absorption of carbon dioxide using different mediums. Liquid adsorbents, such as amines, mono-ethanolamine, or aqueous ammonia, or alkali metal-based solvents such as potassium hydroxide, sodium hydroxide, calcium hydroxide, and other metal-based solvents are employed for solvent separation. Additionally, solid adsorbents like alkali or alkaline earth metals, alkali carbonates (e.g., sodium carbonate, potassium carbonate), solid amines, and zeolites-based sorbents are utilized for solid separation techniques. These all mediums are strategically designed to utilize waste heat and enhance the absorption efficiency of carbon dioxide molecules.

The regeneration process within the unit is also powered by waste heat, ensuring sustainable operation. During regeneration, the saturated mediums are heated, causing the release of captured carbon dioxide. This enables the mediums to be regenerated for reuse in the absorption process, thereby maximizing the system's efficiency and minimizing resource consumption.

Furthermore, the Waste Heat-Powered Carbon Dioxide Capturing Unit incorporates a membrane-based carbon dioxide capture system, adding another layer of versatility and efficiency to the overall process. Membrane separation techniques are employed to concentrate carbon dioxide molecules, complementing the absorption and regeneration methods utilized within the unit.

The integration of these diverse carbon dioxide capture techniques within the waste heat-based absorption and regeneration components enables the system to effectively capture carbon dioxide from various gas streams while optimizing energy utilization. The efficient operation of the unit is facilitated by automated controls, ensuring precise regulation of temperature, pressure, and flow rates throughout the process. This results in a cost-effective and environmentally sustainable solution for mitigating carbon emissions and combating climate change.

In FIG. 8, the system depicted captures carbon dioxide from atmospheric source FIG. 8 of 73. To achieve carbon dioxide absorption at high rate, the system necessitates elevating the gas temperature to an optimal level for the absorber or separator section. This is accomplished using a waste heat-based heater. Waste heat generated from various sources, including the Non-ionized hydrogen gas turbine unit 19, Carbon Dioxide Capturing sub-parts, and waste heat recovery system unit 39, is channeled through pipe to the heat exchange section. Here, the waste heat interacts with the ambient gases and solvents/sorbents/adsorbents 76, raising their temperature to the requisite level. The waste heat, directed through the external portion of pipe, heats the gases within the internal portion of pipes 76, ensuring they attain the desired temperature for the absorber or separator section 76. Subsequently, the heated gases flow into the absorber and separator section 76, where carbon dioxide is separated and absorbed utilizing various solvents, adsorbents, or sorbent chemicals.

In an alternative embodiment of the Carbon Dioxide Capturing System Unit, the system is also configured to absorb carbon dioxide from flue gas emissions. Flue gas released from industrial operations undergoes cooling via heat exchangers integrated into its structure. The flue gas cooler component facilitates the reduction of flue gas temperature to an optimal level for the absorber or separator section. The carbon dioxide capturing process and systems employed for flue gas are akin to those utilized for atmospheric carbon dioxide capture. In the present invention, the methodologies and systems employed for atmospheric carbon dioxide capture are leveraged for capturing carbon dioxide from flue gas emissions.

Figure 6:
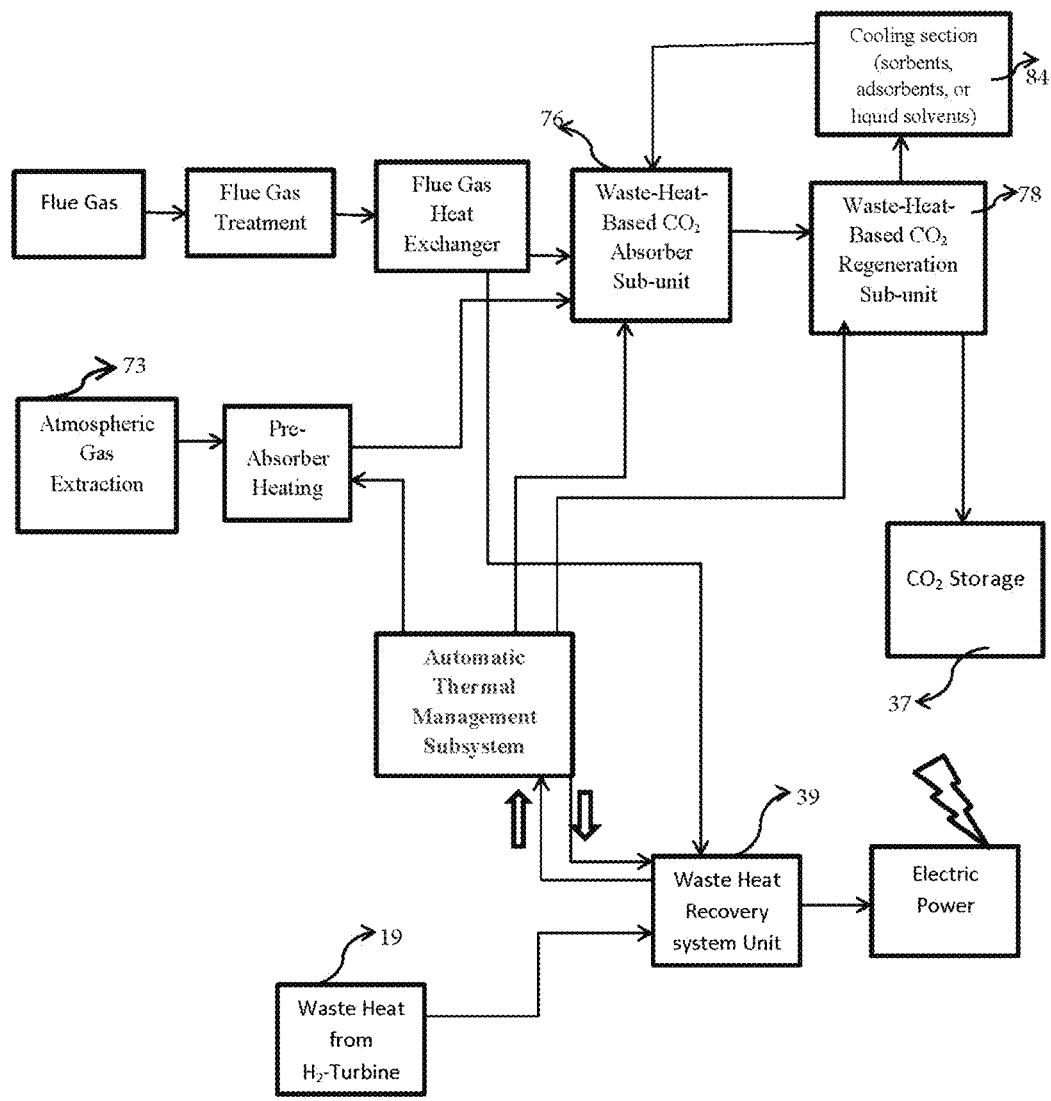
FIG. 6 delineates the carbon dioxide capturing system unit.

In the present system, depicted in FIG. 5 and FIG. 6, the carbon dioxide absorption step 76 and regeneration step 78 harness exhausted waste heat 79A, emanating from sources such as the hydrogen gas turbine unit, carbon dioxide capturing sub-parts, and waste heat recovery system unit. This innovative approach capitalizes on the unique parts, subparts developments, integrations and co-functioning with other units, physical structure of the system, designed to efficiently utilize exhausted waste heat. As discussed earlier, the carbon dioxide capturing system unit presents a novel carbon dioxide absorber and regeneration components, which are powered and operate utilizing waste heat energy.

In FIG. 6, the subsequent step in the carbon dioxide capturing process is the regeneration step. Utilizing different solvents, absorbents, or adsorbents 76, carbon dioxide is absorbed within the system. The saturated solvents/absorbents or adsorbents 76 then proceed to the regeneration step 78, where they are heated to produce carbon dioxide and regenerate for reuse. The system achieves this heating using exhausted waste heat generated from the non-ionized hydrogen gas turbine, and waste heat recovery system unit. Carbon dioxide is subsequently directed into carbon dioxide tanker 37, as depicted in FIG. 6.

Alternatively, the low temperature waste heat released by the Carbon Dioxide Absorber Part 76 and Regeneration Part 78 is redirected back into the Waste Heat Recovery System Unit to facilitate the generation of additional electric power.

The Carbon Dioxide Capturing Unit, depicted in FIG. 5 and FIG. 6, synergistically integrates with various units within a Carbon Dioxide Capturing and Electrical Energy Generating System, such as:

i. The Non-Ionized Hydrogen Gas Turbine Unit, and Waste Heat Recovery Generator System Unit. These components collaborate to utilize exhausted waste heat for both the Carbon Dioxide Absorber Part 76 and Regeneration Part 78.

ii. The Waste Heat Recovery System Unit efficiently provides and recaptures waste heat from the Carbon Dioxide Capturing System Unit. The system provides waste heat to the Carbon Dioxide Absorber Part and Regeneration Part. While the system recovers waste heat originating from the flue gases heat exchanger, the Carbon Dioxide Absorber Part and Regeneration Part are utilized to generate additional electric power. The Waste Heat Recovery System Unit 39, designated and effectively gathers waste heat emanating from various components and units within the system. Subsequently, this waste heat is transformed into electric power through the operations of the Waste Heat Recovery System Unit.

The Carbon Dioxide Capturing System Unit, depicted in FIG. 8, encompasses essential components such as fans, circulation pumps, heat exchangers, regeneration part, carbon dioxide absorber part (comprising sorbents/adsorbents/solvents), re-boiler, stripper, intercoolers, CO2 pumps, and carbon dioxide tankers. These components are seamlessly integrated and adapted onto the carbon dioxide capturing system unit structure to ensure optimal functionality.

As described above, the Carbon Dioxide Capturing and Electrical Energy Generating System invention comprises the Carbon Dioxide Capturing System Unit, depicted in FIG. 8. This unit facilitates the following steps, comprising at least:

i. Employing fans: the fans are situated and adapted on the top of the Carbon Dioxide Capturing System Unit, to intake atmospheric gases from the surrounding environment or flue gases. If, the carbon dioxide is extracted from flue gas, the flue gases are directed into the cooling section before proceeding to the carbon dioxide separator/absorber unit for further cooling and processing.

ii. Heating of atmospheric air within the system using waste heat.

iii. Routing heated atmospheric air to the carbon dioxide separator/absorber part for carbon dioxide absorption using solvents/sorbents/adsorbents.

iv. Transfer of carbon dioxide-saturated solvents/sorbents/adsorbents to the regeneration part v. Heating of the carbon dioxide-saturated solvents/sorbents/adsorbents to produce carbon dioxide, leading to the regeneration of solvents/sorbents/adsorbents for reuse within the unit.

vi. Pumping and storage of captured carbon dioxide gas into designated carbon dioxide tankers for subsequent use or disposal.

As mentioned above, in the current system, the carbon dioxide absorption step 76 and regeneration step 78 are specifically engineered to function efficiently utilizing exhausted waste heat. These steps are integral to the carbon dioxide capturing process, where the carbon dioxide absorber part 76 and regeneration part 78 harness waste heat for optimal operation. As depicted in FIG. 8, various components such as ambient gas absorber fans 73, intercoolers, solvents/sorbents/adsorbents 84, circulation pumps, heat exchangers, re-boiler and stripper, pumps, and other elements of the carbon capturing unit are powered by internally generated electric power, and waste heat facilitating seamless processing of carbon dioxide.

As previously discussed, the objective of heating ambient gases is to enhance the absorption rate and mass transfer of carbon dioxide gas in solvents/absorbents or adsorbents. However, accomplishing this without relying on waste heat-based heaters incurs substantial electric energy consumption, amounting to hundreds of kilowatt-hours to megawatt-hours yearly. Additionally, the conventional carbon capture systems, the regeneration section relies on electric power, resulting in yearly consumption of megawatt-hours of electric energy from the grid. The innovative solution presented here strategically incorporates a novel waste heat-based carbon dioxide regeneration section. These system effectively harnesses waste heat, thereby replacing electric heaters—a significant advancement in carbon capture technology.

As outlined above, the physical composition of the carbon dioxide-capturing unit is not limited to any singular or binary configuration. The system has various physical structures and constituent components and elements that are tailored to and aligned with the various physical structures and designs. Carbon Dioxide Capturing System unit herein is not only unique in the physical structure of the carbon dioxide capturing system, but it is also mainly distinguished from conventional carbon dioxide capturing technologies in terms of invention steps, internal functionality and operations of the system. Furthermore, to facilitate seamless integration into industrial settings, the present application incorporates easily deployable physical structures, which may be similar to those found in standard carbon capture technologies physical structures. This enhances the adaptability and implementation of the invention at different industrial levels easily.

The heat exchanger system configured to optimize thermal conductivity, and efficiency through the advanced heat exchanging systems, advanced thermal conductive material and advanced thermal automation systems. As a result this increases the overall heat exchanger efficiencies and effectively reduces heat energy losses. As set forth above, the carbon dioxide capturing system unit presents a novel carbon dioxide absorber and regeneration components, which are powered and operate utilizing waste heat energy. These components are specifically innovated to harness waste heat energy, thereby enhancing efficiency and sustainability in the carbon capture process.

In summary, the systems and operations of carbon dioxide capturing system from the flue gases (industrial emissions) and ambient air are specifically described and summarized as follows:

A. Carbon Dioxide Capturing System from Flue Gases FIG. 7

As described above, the core of the invention lies in replacing conventional absorbers and regeneration units with innovative waste-heat-based counterparts. By harnessing waste heat generated during industrial processes, the system efficiently captures CO2 from flue gases, contributing to environmental sustainability and energy conservation.

Figure 7:
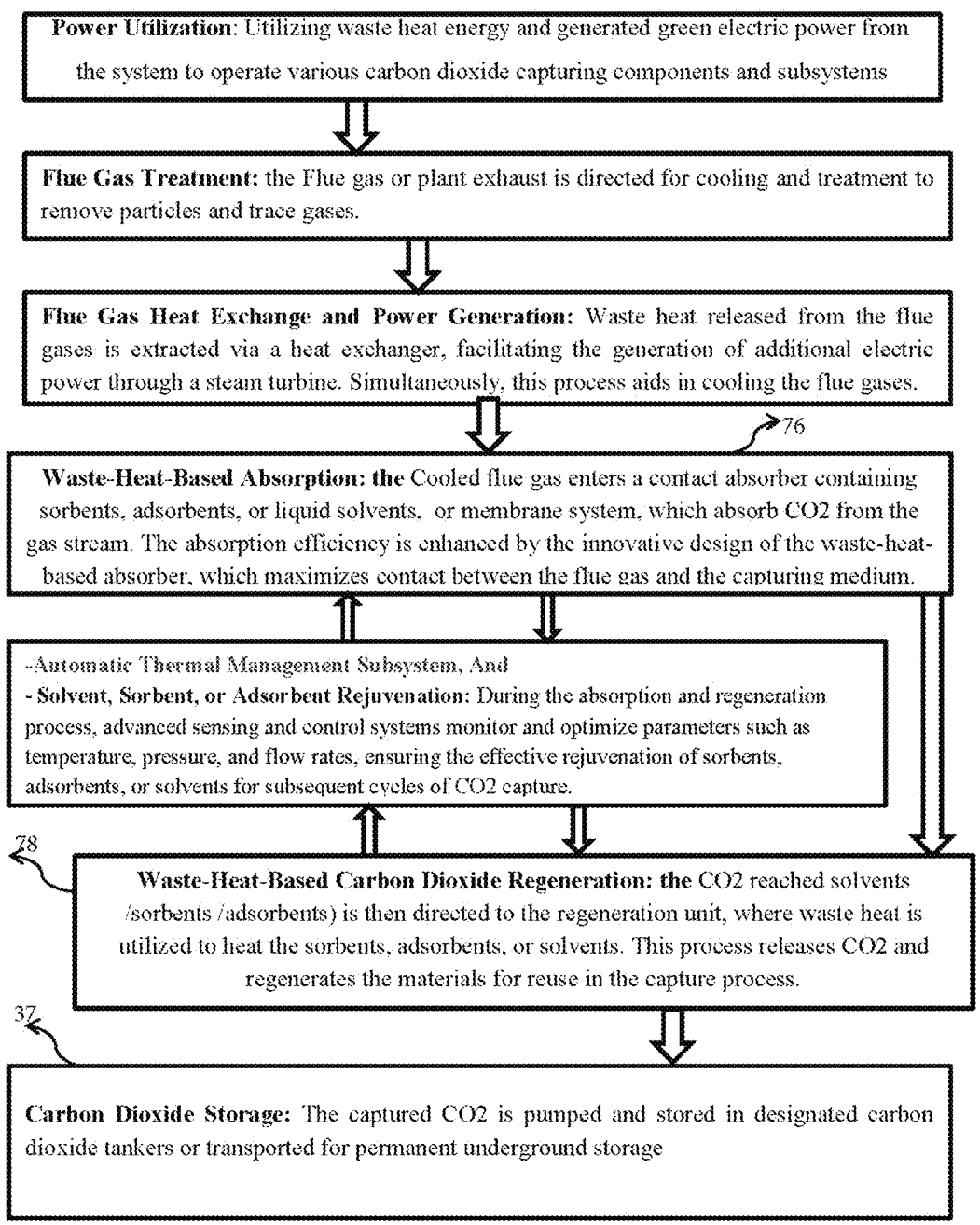
FIG. 7 exhibits the carbon dioxide capturing system from flue gas.

The carbon dioxide capturing system described herein, as depicted in FIG. 6 and FIG. 7 comprises several interconnected units and processes designed to capture CO2 from flue gases emitted during industrial operations. The waste heat powered carbon dioxide Capture from flue gases system at least comprises:

(i) Power Utilization: The system utilizes waste heat energy and generated green electric power from the system to operate various carbon dioxide capturing components and subsystems.

(ii) Flue Gas Treatment: Flue gas or plant exhaust is directed through a duct, where it undergoes cooling and treatment to remove particles and trace gases.

(iii) Heat Exchange and Power Generation:
Waste heat released from the flue gases is extracted via a heat exchanger, facilitating the generation of additional electric power through a steam turbine. Simultaneously, this process aids in cooling the flue gases.

(iv) Waste-Heat-Based Absorption (76):
Cooled flue gas enters a contact absorber containing sorbents, adsorbents, or liquid solvents, or membrane system, which absorb CO2 from the gas stream. The absorption efficiency is enhanced by the innovative design of the waste-heat-based absorber, which maximizes contact between the flue gas and the capturing medium.

(v) Waste-Heat-Based Carbon Dioxide Regeneration (78):
The absorbed CO2 (CO2 reached solvents/sorbents/adsorbents) is then directed to the regeneration unit, where waste heat is utilized to heat the sorbents, adsorbents, or solvents. This process releases CO2 and regenerates the materials for reuse in the capture process. The waste-heat-based regeneration unit is engineered to optimize heat transfer and minimize energy losses during the regeneration process, ensuring high efficiency and cost-effectiveness.

(vi) Solvent, Sorbent, or Adsorbent Rejuvenation:
During the absorption and regeneration process, advanced sensing and control systems monitor and optimize parameters such as temperature, pressure, and flow rates, ensuring the effective rejuvenation of sorbents, adsorbents, or solvents for subsequent cycles of CO2 capture.

(vi) Carbon Dioxide Storage (37):
The captured CO2 is pumped and stored in designated carbon dioxide tankers or transported for permanent underground storage, contributing to carbon sequestration efforts.

Operation of Carbon dioxide Capturing from flue gases:
The system operates by efficiently utilizing waste heat to facilitate CO2 capture from flue gases. The waste-heat-based absorbers and regeneration sub-units are operated by exhausted waste heat released from the non-ionized hydrogen gas turbine and the absorbers and regeneration part is mechanically, electronically and electrically connected, at least with the hydrogen gas turbine and waste-heat system unit. Waste-heat-based absorbers and regeneration sub-units play a pivotal role in enhancing the overall efficiency and effectiveness of the process, thereby contributing to mitigating carbon emissions and promoting environmental sustainability.

The carbon dioxide capturing system unit is developed to capture carbon dioxide from flue gas, employing the following processes and steps:

(a) Utilizing waste heat and harnessing the produced green electric power to energize the carbon dioxide capturing components and sub-components;

(b) Directing the exhaust from the plant or flue gas through designated ductwork;

(c) Cooling the flue gas and subjecting it to treatment to eliminate particles and trace gases;

(d) Extracting waste heat discharged from the flue gases via a heat exchanger to generate supplementary electric power through a steam turbine, concurrently facilitating the cooling of the flue gases;

(e) Introducing the cooled flue gas into a contact absorber containing sorbents, adsorbents, or liquid solvents, which absorb carbon dioxide;

(f) Transmitting the carbon dioxide-saturated sorbents, adsorbents, or solvents to the regeneration section;

(g) Executing the regeneration process, wherein the waste heat-based heater is employed to heat the carbon dioxide-saturated sorbents, adsorbents, or solvents, thereby generating carbon dioxide and regenerating the sorbents, adsorbents, or solvents for subsequent use in capturing $CO_2$ from flue gases anew;

(h) Carbon dioxide Storage: The captured $CO_2$ is pumped and stored in designated carbon dioxide tankers or transported for permanent underground storage, thereby contributing to carbon sequestration endeavors.

These steps collectively facilitate efficient carbon dioxide capture from flue gas emissions, promoting environmental sustainability and mitigating greenhouse gas emissions.

As mentioned earlier, the traditional $CO_2$ capture systems rely on absorbers and regeneration units, which are integral components of the process. These conventional systems, while effective, often face challenges in terms of energy consumption and overall efficiency. The present invention addresses these challenges by introducing novel "waste-heat-based absorbers" and "waste-heat-based regeneration" units, thereby optimizing the $CO_2$ capture process from industrial emissions. Additionally, the system described herein represents a significant advancement in $CO_2$ capture technology, offering improved efficiency and sustainability compared to conventional methods of $Co_2$ Capture from flue gases. By harnessing waste heat for absorption and regeneration processes, the invention demonstrates a practical approach to addressing environmental concerns associated with carbon emissions.

B. Carbon Dioxide Capturing System from Air (FIG. 8)

As described above, the carbon dioxide capturing system unit described herein FIG. 8 provides an innovative solution for capturing $CO_2$ from atmospheric air. By harnessing waste heat as a primary power source, the system enhances efficiency while minimizing environmental impact. Utilizing advanced technological features and operations, such as; the fans, heating systems, waste-heat based absorption, waste-heat based regeneration, and $CO_2$ storage, the system offers a comprehensive solution for $CO_2$ capture and storage.

The carbon dioxide capturing system unit from air at least comprises the following components and processes:

i. Power Utilization:

The system utilizes waste heat energy and generated green electric power from the system to operate various carbon dioxide capturing components and subsystems.

ii. Atmospheric Gas Extraction (73): Utilizing advanced fan technology with variable speed control, atmospheric gases are drawn from the atmosphere with optimized efficiency, maximizing the intake of $CO_2$-rich air.

iii. Pre-Absorber Heating:

In the pre-absorber part of the carbon dioxide capturing system, waste heat generated from Carbon dioxide capturing and electrical energy producing system processes is utilized to heat atmospheric gases. Increasing the temperature of the $CO_2$-reached air boosts the carbon absorbing and capturing efficiency. Advanced heat exchange systems ensure efficient transfer of heat, minimizing energy consumption and maximizing system performance.

iv. Waste-Heat-Based Carbon Dioxide Absorption (76):

The heated atmospheric gases are directed into the waste heat-based carbon dioxide absorber part, where they come into contact with advanced sorbents, adsorbents, or liquid solvents engineered for high $CO_2$ capture efficiency and selectivity. The absorption process is facilitated by the temperature elevation achieved through waste heat utilization, enhancing $CO_2$ capture rates.

iv. Waste-Heat-Based Carbon Dioxide Regeneration (78):

In the waste heat-based regeneration part of the system, captured $CO_2$ sorbents, adsorbents, or solvents are subjected to control heating, facilitated by the utilization of waste heat. Advanced thermal management systems optimize the regeneration process, ensuring thorough $CO_2$ release while minimizing energy input and maximizing system efficiency.

vi. Solvent, Sorbent, or Adsorbent Rejuvenation:

During the absorption and regeneration process, advanced sensing and control systems monitor and optimize parameters such as temperature, pressure, and flow rates, ensuring the effective rejuvenation of sorbents, adsorbents, or solvents for subsequent cycles of $CO_2$ capture.

vii. Carbon Dioxide Storage (37):

The captured $CO_2$ is pumped and stored in designated carbon dioxide tankers equipped with advanced monitoring and safety systems to ensure secure transportation. Alternatively, the $CO_2$ can be transported for permanent underground storage, utilizing advanced injection techniques and monitoring technologies to facilitate safe and effective carbon sequestration.

Operation of Carbon dioxide Capturing from Air: The system operates by efficiently utilizing waste heat to facilitate $CO_2$ capture from flue gases. The waste-heat-based absorbers and regeneration sub-units are operated by exhausted waste heat released from the non-ionized hydrogen gas turbine and the absorbers and regeneration part is mechanically, electronically and electrically connected, at least with the hydrogen gas turbine and waste-heat system unit.

In summary, the carbon dioxide capture system unit from air encompasses several processes and steps, comprising:

i. Utilizing waste heat and harnessing the produced green electric power to energize the carbon dioxide capturing components and sub-components;

ii. Utilizing integrated fans to draw atmospheric gases from the surrounding environment;

iii. Elevating the temperature of the drawn atmospheric gases within the pre-absorber section of the carbon dioxide capture system;

iv. Directing the heated atmospheric gases into the waste heat-driven carbon dioxide absorber section, where carbon dioxide is absorbed utilizing sorbents, adsorbents, or liquid solvents;

v. Transmitting the carbon dioxide-saturated solvents, sorbents, or adsorbents to the waste heat-driven regeneration section of the carbon dioxide capture system;

vi. Subjecting the carbon dioxide-saturated solvents, sorbents, or adsorbents to heat to release carbon dioxide and regenerate the solvents, sorbents, or adsorbents for subsequent use within the system;

vii. Carbon dioxide Storage: The captured $CO_2$ is transferred and stored in designated carbon dioxide tankers or transported for permanent storage, thus aiding in carbon sequestration endeavors.

These steps collectively facilitate the effective capture and storage of carbon dioxide emissions, thereby contributing to environmental sustainability efforts.

Special Advantages Over Existing Carbon Capture Systems from Flue Gases and Direct Air Capture Technologies:

The carbon dioxide capturing system unit offers several advantages over existing CO2 capture technologies, including:

Utilization of waste heat, and clean energy as a primary power source, enhancing system efficiency and reducing environmental impact.

Enhanced CO2 capture rates facilitated by waste heat-based heating processes.

Reduced energy consumption and operational costs through optimized process control and waste heat and clean energy utilization result in economically feasible carbon capture technology.

Traditional and conventional methods for carbon dioxide capture from the atmosphere or flue gas often entail significant external energy consumption, posing challenges for industries in terms of both cost and sustainability. This high energy demand has hindered the economic viability of many carbon dioxide capturing endeavors. The current invention addresses this issue by offering a self-sustaining solution. By simultaneously generating clean electric power and heat energy from the system, the components of the carbon dioxide capture unit are powered by clean electric power and heat energy, thereby significantly reducing the dependence on external energy sources (particularly, from the grid). This not only enhances the feasibility of implementation but also underscores the economic viability and practicality of the present invention.

Moreover, the carbon dioxide capture system unit operates in conjunction and synergistically integrates with other units of Carbon Dioxide Capture and Electrical Energy Generation Systems to facilitate the capturing process.

D. Waste Heat Recovery System Unit

Figure 3:
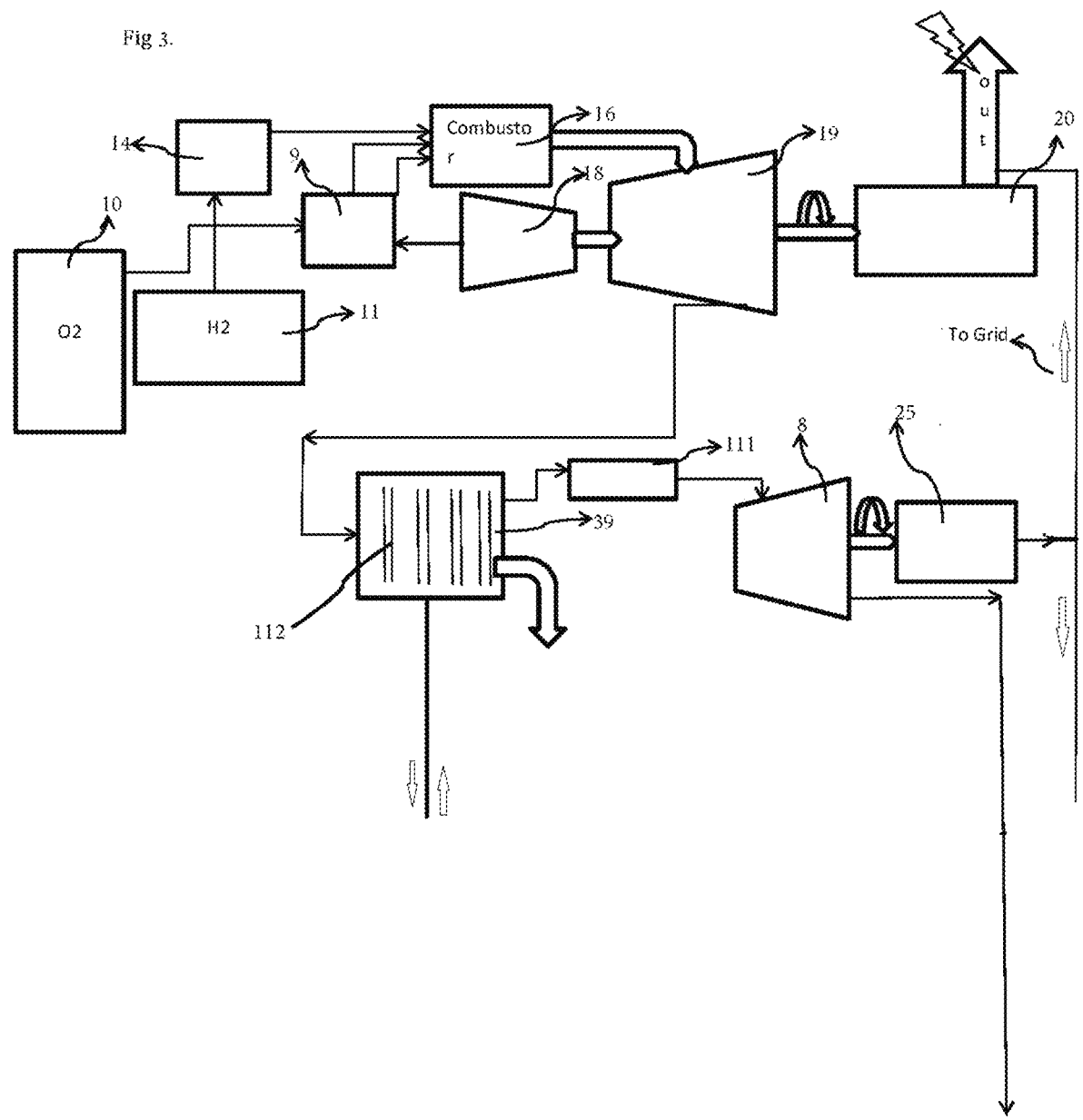
FIG. 3 showcases the co-functioning, arrangements, and integrations of a waste heat generator system unit in conjunction with other carbon dioxide capturing and electric energy generating system units.
Figure 4:
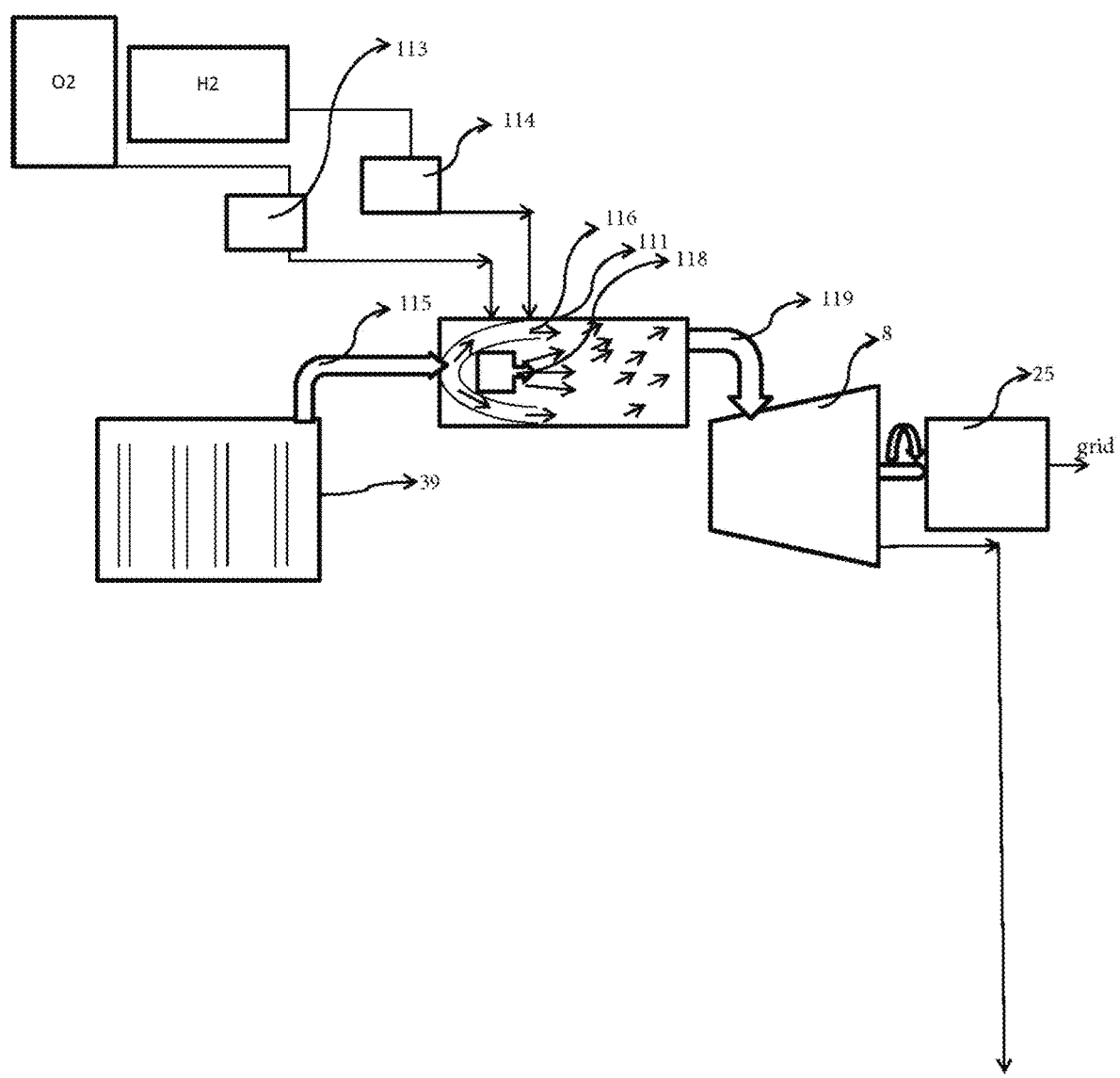
FIG. 4 offers a detailed view of the waste heat generator system unit.

An innovation in carbon dioxide capture and electrical energy producing system invention comprises a waste heat recovery system, as depicted in FIG. 4. This system harnesses the exhaust heat from various components such as the non-ionized hydrogen gas turbine system unit 19, and carbon dioxide capturing system sub-parts within the carbon dioxide capture and electrical energy production setup. The waste heat recovery system efficiently captures and repurposes this thermal energy to drive an additional steam turbine, thereby generating supplementary electric power, as illustrated in FIGS. 3 and 4.

The waste heat recovery system encompasses several key elements, including waste heat sources from the hydrogen gas turbine and other system components, a waste heat recovery generator 39, a steam turbine 8, a hydrogen-oxygen superheater 111, and an electric generator 25.

In various embodiments of the present invention, the waste heat realized from different sources serves distinct purposes. For instance, the waste heat from the non-ionized hydrogen gas turbine 19 is directed into the waste heat recovery generator 39 to power the steam turbine. Subsequently, the resultant waste heat from the recovery generator 39 is directed towards heating the carbon dioxide capture unit 38. In an embodiment, waste heat derived from diverse sources is hereby disclosed, wherein said waste heat is not constrained to a singular application or purpose. The utilization of waste heat from multiple sources is contemplated herein for a plurality of purposes without limitation.

In the present embodiment of the invention, waste heat emanating from hydrogen gas turbine 19, is harvested, recycled, and harnessed to propel steam turbine 8, thereby generating supplemental electrical power 25.

The generator 39 comprises a duct 112 designed to receive the hot exhaust gas from the aforementioned sources. Additionally, it incorporates a heating system intended for the reception of feed water, facilitating its transformation into steam. A heat pipe, featuring a first end positioned within the duct, serves to extract heat, while its second end, situated within the heating system, facilitates the transfer of heat to the feed water. The waste heat recovery steam generator 39 essentially functions as a voluminous duct 112 containing water-filled tube bundles.

To efficiently recover waste heat from the hydrogen gas turbine, a circulation system guides feed water through the tube bundles. Concurrently, the water undergoes heating, transitioning into steam as the exhaust waste gas traverses the duct and interacts with the tube bundles. Waste heat steam generator 39 yields steam from the exhausted waste heat, subsequently channeling it towards hydrogen-oxygen superheater 111 for steam reheating and the generation of high-pressure steam. This high-pressure steam 119 propels steam turbine 8, which in turn drives electric generator 25, thus augmenting electrical power production.

In accordance with FIG. 4, the hydrogen-oxygen superheater 111 system is comprises, such as; an ignition system 118, hydrogen and oxygen gas lines, hydrogen gas flow regulator 114, oxygen flow rate regulator 113, and temperature sensing device. The ignition system 118 is positioned within a steam line to facilitate the direct combustion of hydrogen and oxygen gases.

Hydrogen and oxygen are introduced into the burner in a manner that ensures thorough mixing, promoting stable combustion. By directing hydrogen and oxygen directly into the steam line within the superheater 111, steam temperature can be elevated to levels that mitigate thermal challenges within the turbine.

As depicted in FIG. 4, when steam travels from the waste heat recovery steam generator 39 to the hydrogen-oxygen superheater 111, the superheater initiates operation, elevating the steam temperature to levels suitable for the steam turbine. Throughout operation, hydrogen and oxygen are supplied to the superheater, including burner 118, via supply lines originating from storage tanks 10 and 11, respectively.

The hydrogen and oxygen flow regulators 113 and 114 administer precise quantities of each gas to the burner 118 within the superheater 111, ensuring the steam exiting the superheater maintains the desired temperature. Regulated by a temperature signal from a temperature sensing device integrated into the superheater, valves are adjusted to maintain a stoichiometric ratio. Flow meters gauge the hydrogen and oxygen flow rates to the burners within the superheater 118, with their readings informing regulators and controllers to position valves optimally, thereby sustaining efficient combustion. Consequently, hydrogen and oxygen undergo direct combustion within the steam passing through superheater 111, thereby elevating the steam temperature.

In accordance with FIG. 4, the high-temperature pressurized steam 119 transitions to the steam turbine 8, propelling the electric generator 25 to generate additional electric power. Subsequently, the steam turbine's exhaust steam is routed to the carbon dioxide capturing system unit for further utilization. The residual waste heat from these components is then directed to a condenser, where it transfers its heat to cooling water. The resulting condensate is subsequently pumped back to the waste heat recovery steam generator 39. Maintaining a low absolute pressure in the condenser enhances heat dissipation and plant power.

The waste heat recovery system unit effectively harnesses exhaust waste heat to generate additional electric power, thereby enhancing the value and efficiency of the carbon dioxide capturing and electrical energy production system disclosed herein.

The waste heat recovery system unit encompasses the following steps:
  i. Collecting waste heat discharged from at least the non-ionized hydrogen gas turbine 9, and flue gases
  ii. Converting the waste heat into the waste heat recovery steam generator 39, where the waste heat is utilized to produce steam. This steam then flows to the hydrogen-oxygen superheaters 111 & 116.
  iii. Within the hydrogen-oxygen superheater 111, hydrogen and oxygen gases are combusted to reheat the steam, generating high-pressure steam 119. This high-pressure and temperature steam drive the steam turbine 8, which in turn drives the electric generator 25, thereby generating additional electric power.

In summary; the core Technical Features and Operation of the Waste heat recovery system unit comprising;

1. Waste Heat Recovery System:
    Collects waste heat from various sources including the non-ionized hydrogen gas turbine, and carbon dioxide capturing system sub-parts.
    Utilizes the waste heat to generate steam in the waste heat recovery steam generator (39).
        Directs the produced steam to hydrogen-oxygen superheaters (111 & 116) for further processing.
    Achieves efficient heat recovery and utilization from multiple sources within the system.
2. Hydrogen-Oxygen Superheater (111 & 116):
    Comprises an ignition system (118) and hydrogen and oxygen gas lines.
    Ensures thorough mixing of hydrogen and oxygen gases for stable combustion.
    Directs hydrogen and oxygen gases into the steam line, facilitating direct combustion within the superheater.
        Reheats the steam to high pressure and temperature levels suitable for driving the steam turbine.
3. Steam Turbine (8) and Electric Generator (25):
    Receives high-pressure, high-temperature steam from the hydrogen-oxygen superheater.
    Converts the energy of the steam into mechanical energy to drive the electric generator.
    Produces additional electric power to augment the overall power output of the system.
4. Carbon Dioxide Capturing System:
    Utilizes the exhaust steam from the steam turbine for additional processes.
        Enhances the efficiency of carbon dioxide capturing and subsequent utilization within the system.
5. Condenser:
    Receives residual waste heat from the carbon dioxide capturing system.
    Transfers the heat to cooling water to produce condensate.
    Returns the condensate to the waste heat recovery steam generator for further utilization.
    Maintains low absolute pressure to enhance heat dissipation and overall plant power.

Operation:
    Waste heat from various sources is collected and directed to the waste heat recovery steam generator.
    The waste heat recovery steam generator produces steam, which is then routed to the hydrogen-oxygen superheaters.
    Within the hydrogen-oxygen superheaters, hydrogen and oxygen gases are combusted to reheat the steam to high-pressure, high-temperature levels.
    The high-pressure steam drives the steam turbine, which in turn drives the electric generator to produce additional electric power.
    Exhaust steam from the steam turbine is utilized by the carbon dioxide capturing system, enhancing its efficiency.
    Residual waste heat is transferred to the condenser, where it is dissipated to cooling water to increase plant power efficiency.

A method of waste heat recovery system unit, collecting waste heat released from carbon dioxide capturing and electrical energy system, and converts into electrical energy, the method at least comprising the processes and steps of:
  (a) collecting waste heat exhaust from at least one of a hydrogen gas turbine, carbon dioxide capturing system sub-parts, and flue gas using a series of heat exchangers and ducts configured to capture and transfer the waste heat exhaust to the waste heat recovery steam generator;
  (b) directing the collected waste heat into a waste heat recovery steam generator comprising a series of heat exchangers and a steam drum, wherein the waste heat is used to heat water within the heat exchangers to produce steam, and the steam is separated from the water within the steam drum and flowed into a hydrogen-oxygen superheater system;
  (c) burning hydrogen and oxygen gases directly in the steam line within the hydrogen-oxygen superheater to reheat the steam and produce high pressurized steam, wherein the hydrogen-oxygen superheater comprises a burner, a combustion chamber, and a heat exchanger, and the hydrogen and oxygen gases are mixed and burned within the combustion chamber to heat the steam within the heat exchanger, and the high pressure and temperature steam is flowed into a steam turbine, and the steam turbine drives an electric generator to produce additional electric power, wherein the steam turbine comprises a series of blades and a rotor, and the high pressure and temperature steam is used to rotate the blades and the rotor, and the rotation of the rotor is used to drive the electric generator to produce additional electric power;
  (d) providing waste heat to carbon dioxide capturing system sub-units and receiving the low temperature waste heat released by the carbon dioxide capturing system sub-unit via an integrated and synergistic system with the carbon dioxide capturing sub-units and waste-heat recovery system unit, wherein the waste heat recovery system unit is configured to provide waste heat to the carbon dioxide capturing system sub-units to power the sub-units by waste heat and improve performance, and to receive the low temperature waste heat released by the carbon dioxide capturing system sub-units to improve the overall efficiency and performance of the waste heat recovery system unit;
  Wherein the waste heat recovery system is synergistically integrated and co-functioning with carbon dioxide capturing and electrical energy producing system units in harmony to collect waste heat released from the system, to generate electrical power, and to provide and collect waste heat to and from the carbon dioxide capturing system sub-parts.

As illustrated in FIG. 5 and FIG. 6, the waste heat recovery system unit is not only configured to convert exhaust waste heat released from the system into electric power, like the prior art does. The waste heat recovery system unit has multiple functions. The waste heat recovery system unit is further configured to regulate and facilitate waste heat for carbon dioxide capturing systems unit, and is at least configured to operate the following three functions:

1st: To lower the temperature of the exhaust waste released from the non-ionized hydrogen gas turbine system unit. This step is essential to enable the waste heat to be utilized for the carbon dioxide capture systems unit. The exhaust waste heat generated by the non-ionized hydrogen gas turbine exceeds 500 degrees Celsius. To safely and effectively employ this exhaust waste heat in the Waste Heat-Based Carbon Dioxide Absorber Part, Waste Heat-Based Pre-heating Part, and Waste Heat-Based Carbon Dioxide Regeneration Part, it is necessary to reduce the waste heat temperature to a manageable level suitable for these components, and sorbents/solvents/adsorbents. The waste-heat recovery system unit works in harmony with the carbon dioxide capturing system unit. The waste heat recovery system unit regulates and facilitates the exhaust waste heat to operate the carbon dioxide capturing system unit by utilizing exhaust waste heat as illustrated in FIG. 6.

2nd. The Waste-Heat Recovery system unit is configured as a central heat regulator system for the carbon dioxide capturing system unit. It provides waste heat energy to the Waste-Heat Based Carbon Dioxide Absorber part, Waste-Heat Based Carbon Dioxide Regeneration Part, and Waste-Heat Based Pre-heater parts. The waste heat flows from the waste heat recovery system unit into the carbon dioxide capturing system parts. The waste heat recovery system unit is configured to regulate the heat flow into the carbon dioxide capturing system parts and provide precise waste heat based on real-time feedback.

Simultaneously, the Waste-Heat Recovery system unit is also configured to automatically recapture low-temperature waste heat from the Waste-Heat Based Carbon Dioxide Absorber part, Waste-Heat Based Carbon Dioxide Regeneration Part, and Waste-Heat Based Pre-heater part through the control and monitoring of the Automatic Thermal management system as described in FIG. 6.

3rd. The waste heat recovery system unit is configured to operate in harmony with the automatic thermal management system and solvents/sorbents/adsorbents rejuvenation subsystems to provide waste heat control and monitor the waste heat flow in the waste-heat based carbon dioxide absorption part, waste-heat based carbon dioxide regeneration parts, and automate the heat energy requirements for the systems to operate efficiently and effectively, as described in FIG. 6.

The waste heat recovery system unit synergistically works with the carbon dioxide capturing system unit (waste-heat based carbon dioxide absorption part, waste-heat carbon dioxide regeneration parts, automatic thermal management system, and solvents/sorbents/adsorbents rejuvenation systems).

The configuration and integration of the Waste-Heat Recovery system unit with the carbon dioxide capturing systems parts creates an effective and efficient operation for the Waste-Heat Based Carbon Dioxide Regeneration part and the Waste-Heat-Based Carbon Dioxide Absorption Part. As a result, this significantly contributes to manifesting the invention of the "carbon capture and simultaneous clean energy generation" system.

The special values are positioned, mounted, and fitted with the waste heat recovery system, and the values are controlled by the Automatic Thermal management system to precisely release the required amount of waste heat into the carbon dioxide capturing system. Simultaneously, the other valves automatically recapture low-temperature waste heat from the carbon dioxide capturing system parts and are operated by the Automatic Thermal management system.

These valves work in tandem under the Automatic Thermal Management System, which modulates their operation to balance heat release, capture, and recirculation within the waste heat recovery and carbon dioxide capturing system. In this system, several types of valves play critical roles in managing and optimizing waste heat flow. These valves include but are not limited to Control Valves, Thermal Relief Valves, Temperature-Controlled Valves, Recirculation Valves, and Isolation Valves. As mentioned above, the valves, Automatic Thermal Management System, Waste-Heat Recovery system unit, and carbon dioxide capturing system unit are configured to operate in harmony to create effective and efficient carbon dioxide capturing processes.

The superheater herein utilizes a lower amount of hydrogen to elevate the pressure of the steam to a higher level in order to operate a large steam turbine. The waste heat recovery generator herein generates pressurized steam without a superheater, which is capable of powering the moderate steam turbine. Therefore, the waste heat recovery system unit can also function without a superheat alternatively, without the need for additional hydrogen consumption.

Furthermore, the waste heat recovery system unit co-works and integrates with other systems within the CO2 capturing and electrical energy producing system invention. It harnesses waste heat and converts it into clean energy. The waste heat recovery system unit is integrated and co-functioning with other units such as the non-ionized hydrogen gas turbine system unit, carbon dioxide capturing system unit, hybrid solar hydrogen oxygen gas generator unit, and steam turbine. The synergy among these integrated units-comprising systems, methods, and apparatuses—not only manifests the objectives of the carbon dioxide capturing and electrical energy producing system invention but also presents a robust solution to carbon emissions challenges.

SUMMARY

The present patent application pertains to a non-ionized hydrogen gas turbine-based carbon dioxide capturing and energy production system, originally part of the main application submitted on May 25, 2021. This disclosure encompasses various alternative processes, integrations, physical structures, hybrids, methods, arrangements, and devices, as detailed herein and in the accompanying appendices, serving as illustrative examples without imposing limitations. Additionally, industrial applicability options are considered. Consequently, the inventor reserves the right to disclose substitutions, modifications, additions, and/or rearrangements pertaining to the present invention.

The main submission of May 25, 2021, comprises several alternative embodiments, including but not limited to: a carbon dioxide capturing and energy production system with at least seven alternative embodiments and invention versions (FIGS. 1, 2, 21, 24A, 25, and 24B (in this application illustrated as FIG. 5)), furthermore, the FIG. 2 of the capturing and electrical energy generating system has two alternatives embodiments; one with the hybrid-solid-oxide fuel cell unit and the other without a solid oxide fuel cell unit. Moreover, the main submission of May 25, 2021, comprises a carbon reactor core with two alternative embodiments (FIGS. 14 and 15); a hydrogen gas turbine with two alternative embodiments (the ionized hydrogen gas turbine unit depicted in FIGS. 3 and 6, and the non-ionized hydrogen gas turbine unit shown in FIG. 7); a super heater with two alternative embodiments (FIGS. 17 and 18); and a tree-fashioned carbon dioxide capturing system unit with three additional alternative embodiments (FIGS. 20, 23, and 25), the FIG. 24 has two alternative embodiments:

The FIG. 24A with a tree-fashioned physical structure and without a waste heat recovery system unit, and the second FIG. 24B (in this application illustrated as FIG. 5) configured without a treefashioned physical structure and with an incorporated waste heat recovery system unit. Therefore, in accordance with recommendations from the USPTO office action, the owner accepts their recommendations, and intends to split these versions of invention and submit them separately, and accordingly after this submission.

Furthermore, the invention originally submitted on May 5, 2021, encompasses various processes, integrations, physical structures, hybrids, methods, arrangements, and devices, detailed in the appendices, and also serves as exemplary without imposing limitations. The inventor reserves the right to disclose substitutions, modifications, additions, and/or rearrangements pertaining to this invention.

This invention provides a dual solution to the complex carbon emissions and climate change problems. The current innovation effectively captures carbon dioxide and simultaneously generates electric energy using hydrogen, resulting in zero carbon emissions and eliminating air pollution. The notable economical and environmental advantages it presents include a marked reduction in carbon emissions and air pollutants, addressing pressing issues related to climate change and global warming, while also championing the advancement of clean energy technology for future generations. Consequently, this invention significantly contributes to mitigating the challenges posed by climate change, offering a valuable solution that holds immense potential for the betterment of humanity.

I claim:

1. A system for capturing carbon dioxide and generating electrical energy, the system comprising:
   (a) a non-ionized hydrogen gas turbine unit configured to generate electric power by utilizing hydrogen and oxygen gases, wherein the unit is designed to enhance efficiency in the conversion of chemical energy into electrical energy;
   (b) a carbon dioxide capturing system unit configured to extract and capture carbon dioxide from either the atmosphere or flue gases, wherein the unit is operated using clean electric power and waste heat generated by the system;
   (c) a hybrid solar hydrogen-oxygen gas generator system unit configured to ensure continuous production of hydrogen and oxygen gases, supplying the necessary quantities of hydrogen and oxygen gases to the non-ionized hydrogen gas turbine system unit and hydrogen-oxygen superheater sub-unit to co-generate electric power and heat energy, and simultaneously capture carbon dioxide by utilizing the produced heat energy, wherein the unit utilizes renewable energy sources to sustain the system's operations; and
   (d) a waste recovery system unit configured to capture and utilize waste heat from various system components, including the non-ionized hydrogen gas turbine, flue gases, and carbon dioxide capturing system unit, wherein the unit drives an additional steam turbine to further enhance the system's electrical output, thereby increasing the overall energy efficiency of the system;

wherein the non-ionized hydrogen gas turbine system unit, carbon dioxide capturing system unit, hybrid solar hydrogen-oxygen gas generator system unit, and waste-heat recovery system unit are configured to operate synergistically and create simultaneous carbon capture and clean energy generation, at zero carbon emissions without utilizing hydrocarbons;

wherein the carbon dioxide capturing and electrical energy generating system comprises a plurality of units that cooperate with each other, and wherein the integration of the system includes:
   a) the non-ionized hydrogen gas turbine system unit, wherein the system is integrated and co-functioning with at least: i) the carbon dioxide capturing system unit, ii) the waste heat recovery system unit, and iii) the hybrid solar hydrogen-oxygen gas generator unit; wherein the non-ionized hydrogen gas turbine system unit is co-functioning and integrated with various components of the carbon dioxide capturing system unit, including a carbon dioxide preheater subunit, a carbon dioxide absorber subunit, and a carbon dioxide regeneration subunit, an automatic thermal management subsystem, and a solvent/sorbent/adsorbent rejuvenation subsystems, and wherein the non-ionized hydrogen gas turbine system unit is configured to provide waste heat energy to power the carbon dioxide process by waste heat;
   b) the hybrid solar hydrogen-oxygen gas generator system unit, wherein the system is integrated with at least the non-ionized hydrogen gas turbine system unit and hydrogen-oxygen superheater, and wherein the hybrid solar hydrogen-oxygen gas generator unit is configured to produce hydrogen and oxygen gases for said non-ionized hydrogen gas turbine system unit and hydrogen-oxygen superheater;
   c) the waste heat recovery system unit, wherein the system is integrated and co-functioning with at least: i) the non-ionized hydrogen gas turbine system unit, ii) the hydrogen-oxygen superheater, and iii) the carbon dioxide capturing system unit, and wherein the waste heat recovery system unit is configured to convert exhaust waste heat from said non-ionized hydrogen gas turbine system unit and exhausted flue gas stream into additional electric power;
wherein the waste heat recovery system unit is configured to power the carbon dioxide capturing process by exhaust waste heat released from the system;
wherein the waste heat recovery system unit is configured to regulate and provide waste heat to the carbon dioxide capturing system unit, performing at least the following functions:
   (i) configured to operate as a central heat regulator, supplying and modulating waste heat to the carbon dioxide capturing system unit based on real-time feedback, while automatically recapturing low-temperature waste heat from the unit; and (ii) cooperating with the automatic thermal management subsystems and solvent/sorbent/adsorbent rejuvenation subsystems to control, automate and monitor waste heat flow; and
   d) the carbon dioxide capturing system unit, wherein the system is cooperating in harmony with at least the waste heat recovery system unit, and non-ionized hydrogen gas turbine system unit, and the system is configured to utilize exhaust waste heat from said non-ionized hydrogen gas turbine system unit to operate the carbon dioxide carbon dioxide process;

wherein the carbon dioxide capturing system unit comprises the carbon dioxide absorber sub-unit, the pre-heater sub-unit and the regeneration sub-unit, and wherein the absorber sub-unit is configured to absorb carbon dioxide from flue gas or air using a solvent, sorbent, adsorbent, and the regeneration sub-unit is configured to regenerate the solvent, sorbent or adsorbent using the exhaust waste heat;

wherein the carbon dioxide capturing and electric energy generating system creates dual outcomes by: i) capturing carbon dioxide emissions using waste heat and clean energy, and ii) generating clean energy at zero carbon emissions, thereby increasing energy efficiency and sustainability;

wherein the carbon dioxide capturing and electric energy generating system is configured to simultaneously capture carbon dioxide from external sources and generate clean energy, the system is at least characterized by:
i) the system is configured to provide a dual solution for reducing carbon emissions and supplying clean energy;
ii) the system is configured to generate clean electric power and heat energy through the non-ionized hydrogen gas turbine system unit and the system is configured to operate by hydrogen, and the hydrogen is sourced from renewable sources, thereby achieving zero carbon emissions;
iii) the carbon dioxide capturing system unit is entirely powered by waste heat and clean electric power produced by the system, wherein the carbon dioxide preheater, absorber subunit, and regeneration subunit of the carbon dioxide capturing system unit are specifically configured to use waste heat as the primary energy source for the carbon dioxide absorption and regeneration processes;
iv) the system is configured to capture carbon dioxide from external sources, including emissions from power plants, factories, residential complexes, and the environment, without utilizing hydrocarbons during its operation; and
v) the system is configured to co-generate clean energy, thereby powering factories, providing a comprehensive solution for emissions reduction and energy generation without relying on hydrocarbons;

wherein the system is adaptable for use at least in: i) power generation facilities, including but not limited to coal-fired, natural gas, and biogas power plants, ii) heavy industry such as cement factories, steel and iron production, oil refining, fertilizer, aluminum production, and chemical production facilities, iii) small and large-scale industrial manufacturing facilities, iv) residential complexes, and v) direct air capture of carbon dioxide, and wherein the system is configured to provide clean energy and simultaneously capture carbon dioxide emissions, reducing the environmental footprint of these facilities;

wherein the system is configured to increase the net power output and overall efficiency of power generation plants by: i) capturing carbon dioxide emissions using waste heat energy, ii) reducing energy requirements for carbon capture compared to conventional methods, and increasing the net power output, and iii) further supplementing the generated clean energy by the system to the net power output, further increasing the overall net output power, and overall system efficiency of the power plants.

2. The carbon dioxide capturing and electrical energy generating system of claim 1, further comprising the carbon dioxide capturing system unit configured to capture carbon dioxide from flue gases and air, wherein the system at least comprising:
a) an exhausted waste heat-based heater configured to utilize waste heat recovered from a hydrogen gas turbine unit and a waste heat recovery unit, said heater being designed with a heat exchanger to transfer waste heat to incoming gases containing carbon dioxide, thereby maximizing the efficiency of carbon dioxide absorption and regeneration processes;
b) a carbon dioxide waste heat-based absorber part comprising carbon dioxide solvents/sorbents/adsorbents, said absorber part being designed to expose heated gases to the solvents/sorbents/adsorbents for the absorption of carbon dioxide, and being designed with a packed bed or a plate column to maximize contact between the gases and the absorbent materials;
c) a waste heat-based regeneration part configured to receive solvents/sorbents/adsorbents saturated with carbon dioxide from the carbon dioxide absorber part, and to heat said solvents/sorbents/adsorbents to release captured carbon dioxide gas, thereby restoring the solvents/sorbents/adsorbents for reuse, said regeneration part being designed with a desorption column and a condenser to efficiently release and collect the carbon dioxide gas;
d) a carbon dioxide compressor configured to compress and store carbon dioxide in a carbon dioxide storage tank, said compressor being designed to handle high pressures and being equipped with a cooling system and a safety valve; and
e) a carbon dioxide storage tank designed to store compressed carbon dioxide safely, said tank being made of materials resistant to high pressures and corrosion, and being equipped with a pressure relief valve and a level indicator;

wherein the carbon dioxide capturing system unit is engineered to utilize waste heat derived from the non-ionized hydrogen gas turbine unit for the carbon dioxide absorption and separation process, and the regeneration step, and is engineered to be unique, cost-effective, easily deployable, highly efficient and integratable into an existing carbon dioxide capture technologies system;

wherein the carbon dioxide capturing system unit is fully powered by internally generated electricity and waste heat from the system, thereby reducing dependence on external energy sources;

wherein the carbon dioxide capturing system unit employs various carbon dioxide absorption techniques, including solvents, sorbents, membranes, and cryogenics, and is configured to capture carbon dioxide from diverse sources, such as atmospheric or flue gases;

wherein the carbon dioxide regeneration sub-unit for the regeneration of carbon dioxide utilizing waste heat, said sub-unit being adapted to receive carbon dioxide-saturated solvents/sorbents/adsorbents from the carbon dioxide absorber sub-unit;

wherein the regeneration sub-unit is configured to facilitate the heating of said saturated solvents/sorbents/adsorbents, thereby liberating carbon dioxide, and further wherein unsaturated solvents/sorbents/adsorbents are then transported to the cooling section of the machine for subsequent reuse;

wherein the carbon dioxide regeneration part encompasses a variety of heat configuration types selected from the group consisting of fluidized-bed heater, rotary-kiln heater, belt-conveyor heater, screw-conveyor heater, fluid-bed-dryer heater, and indirect-heat exchanger heater, and wherein said diverse types of waste heat-based carbon dioxide regeneration heaters have been innovatively developed to operate in harmony with the carbon dioxide absorber part, the hydrogen gas turbine unit systems, and the waste heat recovery unit system;

wherein the waste heat-based carbon dioxide absorber further comprises a heat transfer mechanism, such as a shell and tube-heat exchanger, to elevate the temperature of the carbon dioxide and increase the absorption rate in the system, and the heater have been innovatively developed to operate in harmony with the carbon dioxide regeneration part, the hydrogen gas turbine unit systems, and the waste heat recovery unit system;

wherein the carbon dioxide capturing system unit is specifically engineered to function efficiently utilizing exhausted waste heat for the carbon dioxide absorption and regeneration processes, and is configured to replace electric heaters with a novel waste heat-based carbon dioxide regeneration part, thereby significantly reducing electric energy consumption;

wherein the waste heat-based carbon dioxide absorbing and regenerating system utilizes and operates by waste heat as its primary energy source and at least comprises: an automatic thermal management subsystem configured to monitor and control the temperature within the system, comprising temperature sensors, pressure sensors, and control valves that regulate the flow of waste heat to maintain optimal operating conditions for the absorption and regeneration processes, and automatically adjust the temperature levels for the carbon dioxide absorbing and regenerating parts; and wherein the automatic thermal management subsystem synergistically works with the waste heat recovery system unit and hydrogen turbine system unit, facilitating the carbon dioxide absorbing and regenerating parts by channeling waste heat through a heat exchanger system to enable efficient heat transfer.

3. The system of claim 2, wherein the carbon dioxide capturing system unit is configured to utilize various mediums to capture carbon dioxide from flue gas or ambient air, and the system comprises at least:
a) liquid solvents including but not limited to:
i) amines, including monoethanolamine;
ii) alkali metal-based solvents comprising potassium hydroxide, sodium hydroxide, and calcium hydroxide,
b) solid sorbents selected from:
i) alkali metal carbonates, comprising at least one of sodium carbonate, and potassium carbonate;
ii) alkali or alkaline earth metal oxides or hydroxides capable of chemically reacting with carbon dioxide to form carbonates or bicarbonates;
c) solid adsorbents selected from:
i) zeolite-based adsorbents;
ii) solid amines, including monoethanolamine; or other porous materials capable of physically adsorbing carbon dioxide through surface interactions; and
d) membrane separation system configured to selectively remove carbon dioxide from gas streams;

wherein the carbon dioxide capturing system unit is configured to absorb carbon dioxide from flue gas or ambient air using a combination of physical and chemical capture techniques;

wherein the carbon dioxide absorber sub-unit is configured to capture carbon dioxide from flue gases or air by using the carbon capturing mediums, and wherein the waste heat energy is configured to elevate the temperature of the carbon capture mediums to the specifically required temperature level and increase carbon capture efficiency;

wherein the carbon dioxide reached mediums in the carbon dioxide absorber sub-unit is transported into the carbon dioxide regeneration sub-unit to regenerate the capturing mediums for reuse;

wherein the carbon dioxide regeneration sub-unit utilizes an exhausted waste heat-based heater to regenerate the carbon dioxide saturated mediums of sorbents, adsorbents, or solvents;

wherein the carbon dioxide absorber sub-unit and regeneration sub-unit are synergistically working at least with:
i) the waste-heat recovery system unit; the waste-heat recovery system unit is configured to provide waste heat and control the waste heat flow, thereby utilizing thermal energy to operate the carbon capture process efficiently; and
ii) the automatic thermal management subsystem; the automatic thermal management subsystem is configured to operate the absorption or regeneration processes;

wherein the carbon dioxide capturing system unit is adaptable to switch between or combine multiple mediums to capture carbon dioxide based on gas composition, temperature, or operational parameters;

wherein the sorbents, adsorbents, or solvents are fitted in the waste-heat-based carbon dioxide absorber sub-unit to capture carbon dioxide from flue gas or air;

wherein the waste heat exchanger system of the carbon dioxide preheater sub-unit, absorber sub-unit, and regeneration sub-unit comprises various sizes and structures, and the sub-units are designed based on the specific requirements of the carbon dioxide capturing mediums, and wherein the waste heat exchangers are tailored to align with the operational requirements of each capturing medium, including but not limited to temperature range, thermal properties, chemical stability, and functional parameters necessary for effective operation;

wherein the exhausted waste heat-based heater is operated by exhausted waste heat released from the non-ionized hydrogen gas turbine system unit; and wherein the carbon dioxide absorber sub-unit and regeneration sub-unit are mechanically, electronically, and electrically connected with at least the non-ionized hydrogen gas turbine system unit and waste heat recovery system unit to utilize the waste heat released from the system.

4. The carbon dioxide capturing system unit as recited in claim 2, characterized by its configuration to establish a synergistic integration with a plurality of units within the carbon dioxide capturing and electrical energy generating system, comprising a non-ionized hydrogen gas turbine unit and a waste heat recovery generator system unit, wherein the integration aims to enhance the carbon dioxide capturing process from a multitude of sources, including but not limited to industrial emissions and direct atmospheric capture.

5. The carbon dioxide capturing and electrical energy generating system of claim 2, further comprising:
   a) a carbon dioxide capturing system from flue gas, the system at least comprising:
      i) a flue gas intake part, said intake part being designed to receive flue gases from an industrial source;
      ii) a flue gas cooling and treatment part, said treatment part being designed to cool and treat the flue gases to remove particles and trace gases;
      iii) a flue gas waste heat recovery part, said recovery part being designed to extract waste heat from the cooled flue gases to generate additional electric power through a steam turbine;
      iv) the waste-heat-based carbon dioxide absorption part, said absorber part being designed to utilize waste heat to enhance the absorption efficiency of carbon dioxide from the cooled flue gases;
      v) the waste-heat-based carbon dioxide regeneration part, said regeneration part being designed to utilize waste heat to release captured carbon dioxide gas and restore solvents/sorbents/adsorbents for reuse;
      vi) a carbon dioxide compression and storage part, said compression and storage part being designed to compress and store the captured carbon dioxide gas for subsequent use or disposal; wherein the carbon dioxide capturing system from flue gas is engineered to utilize waste heat from the flue gases for the carbon dioxide absorption and regeneration processes, and is configured to capture the carbon dioxide content in the flue gases, thereby significantly reducing the need for external energy sources and enhancing overall system efficiency and sustainability;
   b) a carbon dioxide capturing system from air, the system at least comprising:
      i) an air intake part, said intake part being designed to draw atmospheric air from the surrounding environment;
      ii) a pre-absorber heating part, said heating part being designed to utilize waste heat to elevate the temperature of the drawn atmospheric air, thereby enhancing carbon dioxide absorption efficiency;
      iii) the waste-heat-based carbon dioxide absorption part, said absorber part being designed to utilize waste heat to enhance the absorption efficiency of carbon dioxide from the heated atmospheric air;
      iv) the waste-heat-based carbon dioxide regeneration part, said regeneration part being designed to utilize waste heat to release captured carbon dioxide gas and restore solvents/sorbents/adsorbents for reuse;
      v) a carbon dioxide compression and storage part, said compression and storage part being designed to compress and store the captured carbon dioxide gas for subsequent use or disposal;
      wherein the carbon dioxide capturing system from air is engineered to utilize waste heat for the carbon dioxide absorption and regeneration processes, and is configured to capture at least 400 parts per million of carbon dioxide from the atmospheric air, thereby significantly reducing the need for external energy sources and enhancing overall system efficiency and sustainability.

6. The Carbon dioxide capturing and electrical energy generating system of claim 2, wherein the carbon dioxide capturing system from flue gas and the carbon dioxide capturing system from air are configured to operate independently, or in conjunction and utilize waste heat and generated green electric power to enhance overall efficiency and reduce environmental impact, and are configured to synergistically integrate with other units of carbon dioxide capture and electrical energy generation systems to facilitate the capturing process and enhance overall efficiency, and are configured to utilize advanced sensing and control systems to monitor and optimize parameters such as temperature, pressure, and flow rates, ensuring effective carbon dioxide capture and rejuvenation of solvents/sorbents/adsorbents for subsequent cycles, and are configured to utilize liquid solvents, solid sorbents, or membrane-based systems to enhance carbon dioxide capture efficiency and adapt to diverse sources of carbon dioxide-containing gases, and are configured to utilize waste heat and clean energy as primary power sources, thereby significantly reducing the dependence on external energy sources and enhancing overall system efficiency and sustainability;
   wherein the carbon dioxide capturing system unit, the carbon dioxide capturing system from flue gas, and the carbon dioxide capturing system from air further comprise:
      (a) the carbon dioxide capturing system unit configured to synergistically integrate with various other units within the system to redirect low temperature waste heat released by a carbon dioxide absorber part and a regeneration part back into a waste heat recovery system unit;
      (b) essential components seamlessly integrated and adapted onto the carbon dioxide capturing system unit structure, including fans, circulation pumps, heat exchangers, the regeneration part, the carbon dioxide absorber part, a re-boiler, a stripper, intercoolers, carbon dioxide pumps, and carbon dioxide tankers;
      (c) wherein the carbon dioxide capturing system unit is further configured to precisely facilitate capturing processes of carbon dioxide from flue gas and air;
      (d) wherein the system is designed to optimize energy efficiency and minimize waste heat by recirculating the low temperature waste heat within the waste heat recovery system unit; and
      (e) wherein the carbon dioxide capturing system unit is configured to utilize automated controls for precise regulation of temperature, pressure, and flow rates throughout the process, and is configured to redirect low temperature waste heat released by the carbon dioxide absorber part and regeneration part back into the waste heat recovery system unit to facilitate the generation of additional electric power.

7. A method of operating the carbon dioxide capturing system unit of claim 2, the method comprising:
   (i) a method of capturing carbon dioxide from flue gas comprising at least the steps and processes of:
      (a) utilizing waste heat and generated green electric power to energize the carbon dioxide capturing components and sub-components, thereby maximizing energy efficiency and reducing dependence on external power sources;
      (b) directing flue gas through designated ductwork, facilitating the safe and controlled transport of exhaust gases;
      (c) cooling the flue gas and subjecting it to treatment to remove particles and trace gases, thereby enhancing the overall efficiency of the carbon dioxide capture process;
      (d) extracting waste heat discharged from the flue gases via a heat exchanger to generate supplementary electric power through a steam turbine, concurrently facilitating the cooling of the flue gases and further optimizing energy efficiency;

(e) introducing the cooled flue gas into a contact waste-heat-based absorber containing sorbents, adsorbents, or liquid solvents, which selectively absorb carbon dioxide, thereby enabling efficient separation of CO2 from other gases;

(f) transmitting the carbon dioxide-saturated sorbents, adsorbents, or solvents to the waste-heat-based carbon dioxide regeneration part, wherein the waste-heat-based carbon dioxide regeneration part utilizes the exhaust waste-heat-based heater to heat the saturated sorbents, adsorbents, or solvents, releasing captured carbon dioxide gas and regenerating the sorbents, adsorbents, or solvents for subsequent reuse in capturing CO2 from flue gases;

(g) storing the captured carbon dioxide in designated carbon dioxide tankers or transporting it for permanent underground storage; and (ii) a method of capturing carbon dioxide from air comprising at least the steps and processes of:

a) utilizing waste heat and generated green electric power to energize the carbon dioxide capturing components and sub-components, thereby maximizing energy efficiency and reducing dependence on external power sources;

b) employing integrated fans to draw atmospheric gases from the surrounding environment, facilitating the controlled intake of air for carbon dioxide capture;

c) elevating the temperature of the drawn atmospheric gases within the pre-absorber part of the carbon dioxide capture system, enhancing the efficiency of the subsequent absorption process;

d) directing the heated atmospheric gases into the waste heat-based carbon dioxide absorber part, wherein carbon dioxide is selectively absorbed utilizing sorbents, adsorbents, or liquid solvents, enabling efficient separation of CO2 from other gases;

e) transmitting the carbon dioxide-saturated solvents, sorbents, or adsorbents to the waste-heat-based carbon dioxide regeneration part of the carbon dioxide capture system, wherein the saturated solvents, sorbents, or adsorbents are subjected to heat to release captured carbon dioxide gas and regenerate the solvents, sorbents, or adsorbents for subsequent reuse within the system;

f) storing the captured carbon dioxide in designated carbon dioxide tankers or transporting it for permanent underground storage, thereby contributing to carbon sequestration efforts and reducing overall greenhouse gas emissions.

8. The system of claim 1, wherein the non-ionized hydrogen gas turbine unit comprises:

a) a hydrogen gas source, wherein the hydrogen utilized in the process is sourced from various outlets, including hydrogen-oxygen generators powered by solar and other renewable sources, and the non-ionized hydrogen gas turbine unit is designed to accommodate different types of hydrogen from renewable sources to power the carbon dioxide capturing and electrical energy generating system;

b) an automatic hydrogen gas regulator and an oxygen and ambient gases mixing regulator for controlling and optimizing the flow and mixing of gases;

c) a temperature sensor and a pressure sensor for providing real-time data on temperature and pressure within the system;

d) a compressor, a turbine, and an electric generator for facilitating the compression, expansion, and conversion of mechanical energy into electrical power;

e) a combustor for igniting hydrogen and oxygen gases, wherein the hydrogen is sourced from various renewable sources, and the combustion-generated gas is directly fed into the gas turbine for unprecedented high conversion efficiency of electricity; and f) a sub-unit for injecting and intermixing non-combustible gas with the burnable gas mixture;

within the combustion chamber for altering the burn rate of hydrogen, wherein the sub-unit comprises a gas mixing regulator for controlling the volume of non-combustible gas injected into the combustion chamber, and the introduction of non-burnable gas serves to restrict the speed of hydrogen and oxygen atom combustion within the chamber, enhancing versatility, applicability, and safety.

9. The non-ionized hydrogen gas turbine system unit of claim 8, at least further comprising:

a) real-time feedback from temperature and pressure sensors for enabling the system to dynamically adjust combustion parameters, ensuring stable and efficient operation across varying operating conditions; and b) comprehensive safety measures, including flame detection systems, pressure relief valves, and emergency shutdown mechanisms, for safeguarding against potential hazards associated with hydrogen combustion.

10. The system of claim 8, wherein the high-temperature-resistant materials are utilized throughout the system to withstand the extreme operating conditions encountered during hydrogen combustion, ensuring long-term reliability and durability, and further comprises:

a) a seamless integration of the non-ionized hydrogen gas turbine unit into the overall carbon dioxide capturing and electrical energy-producing system, allowing for efficient coordination and operation alongside other system components; and b) an advanced control system for overseeing the operation of the non-ionized hydrogen gas turbine unit, coordinating the interaction between various subsystems to optimize overall system performance while maintaining safe operating conditions.

11. The system of claim 8, wherein said system synergistically and co-functionally works in dependence with other carbon dioxide capturing and electrical energy generating system units, wherein said other system units comprise:

(a) the hybrid solar hydrogen-oxygen fuel cell unit configured to produce hydrogen and oxygen gases for said non-ionized hydrogen gas turbine system units;

(b) the waste heat recovery system unit configured to convert exhaust waste heat from said non-ionized hydrogen gas turbine system unit, exhausted flue gases and carbon dioxide capturing system unit, into additional electric power, wherein the waste heat recovery system unit comprises a heat exchanger and a steam turbine, and wherein the heat exchanger is configured to transfer the exhaust waste heat to a working fluid, and the steam turbine is configured to generate additional electric power from the working fluid; and (c) the carbon dioxide capturing system unit configured to utilize exhaust waste heat from said non-ionized hydrogen gas turbine system unit to power the carbon dioxide absorber, and regeneration sub-units, wherein the carbon dioxide capturing system unit comprises an absorber sub-unit, pre-heater sub-unit and a regeneration sub-unit, and wherein the absorber sub-unit is configured to absorb carbon dioxide from a gas stream using a solvent, and the regeneration sub-unit is configured to regenerate the solvent using the exhaust waste heat.

12. A method for operating the non-ionized hydrogen gas turbine system unit of claim 8, method at least comprising:
   i. producing hydrogen and oxygen from a hydrogen-oxygen generator, utilizing renewable energy sources;
   ii. alternatively utilizing externally sourced green hydrogen from various renewable energy sources to operate the system;
   iii. adjusting the levels of hydrogen, oxygen, and non-combustion ambient gases, and adjusting the injection timing of hydrogen gas into the combustion process;
   iv. introducing the adjusted hydrogen gases into the combustor to combust with oxygen and ambient gases;
   v. employing high-temperature pressurized gas produced by the process to drive one or more non-ionized hydrogen gas turbines, thereby producing electric power or driving a shaft for a useful purpose; and
   vi. directing the exhaust waste heat released from the non-ionized hydrogen gas turbine system unit into the waste heat recovery system unit and the carbon dioxide capturing system unit for harnessing waste heat energy.

13. The carbon dioxide capturing and electrical energy generating system of claim 1, comprising: the hybrid solar hydrogen-oxygen gas generator system unit, wherein the hybrid solar hydrogen-oxygen gas generator system unit comprises a renewable energy-based hydrogen-oxygen generator for continuously and sustainably producing hydrogen and oxygen gases from renewable energy sources, and for facilitating the supply of hydrogen gas to the carbon dioxide capturing and electric power generation system, wherein the renewable energy sources comprise one or more of solar, wind, ocean energy, and hydroelectric power for exclusively powering electrolyzer cells of the hydrogen-oxygen gas generating unit, ensuring an uninterrupted production of hydrogen and oxygen gases and for facilitating the supply of hydrogen gas to the carbon dioxide capturing and electric power generation system, wherein the hybrid solar hydrogen-oxygen gas generator system unit synergistically works with:
   a) the non-ionized hydrogen gas turbine unit utilizing hydrogen and oxygen gases produced from the hybrid solar hydrogen-oxygen gas generator system unit for co-generating electric power and heat energy, and wherein the waste heat from the non-ionized hydrogen gas turbine unit is used for a carbon dioxide absorption and regeneration process;
   b) the waste heat recovery system unit producing pressurized steam from diverse waste heat sources and employing hydrogen within superheater sub-unit to elevate steam pressure to its maximum, propelling a sizable steam turbine for additional electric power generation; and
   wherein the hybrid solar hydrogen-oxygen gas generator system unit utilizes externally sourced sodium hydroxide base or other alkali bases to generate hydrogen and oxygen gases, and comprises solar energy source, cathode, anode electrodes, and electrolytic alkali chemicals such as sodium hydroxide or alternatively potassium hydroxide or other alkali base, and provides hydrogen gas to the carbon dioxide capturing and electric power generation system.

14. The system according to claim 13, wherein the hybrid solar hydrogen-oxygen gas generator system unit is amatively located at separate sites from the overall system, with hydrogen being transported to the carbon dioxide capturing and electric power generation plant, and wherein the system can alternatively incorporate external hydrogen fuel sources generated from various origins of renewable energy sources, and wherein the carbon dioxide-capturing system unit is powered with waste heat and green energy, and wherein the major surplus generated green electric power is stored and/or integrated into the grid or utilized for commercial applications, and wherein the produced oxygen gas from the hydrogen oxygen gas generator sub-unit is also utilized for other industrial applications.

15. The carbon dioxide capturing and electrical energy generating system of claim 1 comprising the waste heat recovery system unit, said waste heat recovery system unit comprising:
   a) a waste heat recovery generator configured to receive exhaust heat from a hydrogen gas turbine system unit and other system components, and to convert feed water into steam;
   b) a hydrogen-oxygen superheater configured to receive the steam from the waste heat recovery generator and elevate the steam temperature using hydrogen and oxygen gases;
   c) a steam turbine configured to receive the high-pressure, high-temperature steam from the hydrogen-oxygen superheater and generate electrical power;
   d) an electric generator configured to receive mechanical power from the steam turbine and generate electrical power; and
   e) a condenser configured to receive residual waste heat from the carbon dioxide capturing system and the carbon dioxide reactor core, transfer the heat to cooling water to produce condensate, and return the condensate to the waste heat recovery generator;
   wherein the waste heat recovery generator comprises a duct configured to receive the hot exhaust gas from the hydrogen gas turbine system unit and carbon dioxide capturing system components, and a heat pipe configured to extract heat from the duct and transfer it to the feed water;
   wherein the hydrogen-oxygen superheater comprises an ignition system, hydrogen and oxygen gas lines, hydrogen gas flow regulator, oxygen flow rate regulator, and temperature sensing device;
   wherein the waste heat recovery system unit is configured to collect waste heat from the hydrogen gas turbine system unit, solid oxide fuel cell, and hydrogen-chlorine fuel cell, and convert the waste heat into steam in the waste heat recovery generator;
   wherein the waste heat recovery system unit is configured to direct the produced steam from the waste heat recovery generator to the hydrogen-oxygen superheater for further processing;
   wherein the waste heat recovery system unit is configured to achieve efficient heat recovery and utilization from multiple sources within the system;
   wherein the waste heat recovery system unit is configured to enhance the efficiency of carbon dioxide capturing and subsequent utilization within the system by utilizing the exhaust steam from the steam turbine for additional processes;
   wherein the waste heat recovery system unit is configured to maintain low absolute pressure in the condenser to enhance heat dissipation and overall plant power;

wherein the waste heat recovery system unit is integrated and co-functioning with other units such as the non-ionized hydrogen gas turbine system unit, carbon dioxide capturing system unit, hybrid solar hydrogen oxygen gas generator unit, and steam turbine, harnessing waste heat and converting it into clean energy;

wherein the waste heat recovery system unit is synergistically integrated with other systems within the carbon dioxide capturing and electrical energy producing system, manifesting the technical objectives of the system and presenting a robust solution to carbon emissions challenges;

wherein the waste heat recovery system unit utilizes the waste heat to facilitate the capture of carbon dioxide in the carbon dioxide capturing system unit;

wherein the waste heat recovery system unit is configured to repurpose the thermal energy from the exhaust heat to drive an additional steam turbine, thereby generating supplementary electric power;

wherein the waste heat recovery system unit is configured to utilize waste heat from multiple sources for a plurality of purposes without limitation;

wherein the waste heat recovery system unit is configured to capture, recycle, and utilize waste heat to drive the steam turbine, thereby producing additional electrical power, and also configured to simultaneously exchange waste heat with the waste-heat-based carbon dioxide absorber and regeneration sub-units;

wherein the waste heat recovery system unit is configured to regulate and provide waste heat to the carbon dioxide capturing system unit, performing at least the following functions: (i) reducing the exhaust temperature from the non-ionized hydrogen gas turbine, which exceeds 500 degrees Celsius, to a level suitable for the carbon dioxide capturing components, including a carbon dioxide absorber, pre-heater, and regeneration parts, to enable safe and effective operation with sorbents, solvents, or adsorbents;

(ii) configured to operate as a central heat regulator, supplying and modulating waste heat to the carbon dioxide absorber, carbon dioxide pre-heater, and carbon dioxide regeneration parts based on real-time feedback, while automatically recapturing low-temperature waste heat from these parts via an automatic thermal management system; and (iii) coordinating with the automatic thermal management system and rejuvenation subsystems to control and monitor waste heat flow within the carbon dioxide absorption, carbon dioxide regeneration, and carbon dioxide pre-heating parts, thereby automating heat energy delivery to facilitate efficient and effective carbon dioxide capturing processes;

wherein the waste heat recovery generator is alternatively configured to generate pressurized steam without a superheater, which is capable of powering the moderate steam turbine, thereby reducing the need for additional hydrogen consumption; and wherein the waste heat recovery system unit is configured to use the waste heat to power the carbon dioxide capture system unit and facilitate the capture process, thereby achieving synergistic and interdependent capture of carbon dioxide and simultaneous generation of electricity.

16. A method for operating the waste heat recovery system unit of claim 15, wherein the system is configured to recover waste heat and convert it into electrical energy, while simultaneously regulating and supplying the recovered waste heat to the carbon dioxide capturing system unit, the method at least comprising:

(a) collecting waste heat exhaust from at least one of a hydrogen gas turbine, carbon dioxide capturing system unit, and flue gas using a series of heat exchangers and ducts configured to capture and transfer the waste heat exhaust to the waste heat recovery steam generator;

(b) directing the collected waste heat into a waste heat recovery steam generator comprising a series of heat exchangers and a steam drum, wherein the waste heat is used to heat water within the heat exchangers to produce steam, and the steam is separated from the water within the steam drum and flowed into a hydrogen-oxygen superheater system;

(c) burning hydrogen and oxygen gases directly in the steam line within the hydrogen-oxygen superheater to reheat the steam and produce high pressurized steam, wherein the hydrogen-oxygen superheater comprises a burner, a combustion chamber, and a heat exchanger, and the hydrogen and oxygen gases are mixed and burned within the combustion chamber to heat the steam within the heat exchanger, and the high pressure and temperature steam is flowed into a steam turbine, and the steam turbine drives an electric generator to produce additional electric power, wherein the steam turbine comprises a series of blades and a rotor, and the high pressure and temperature steam is used to rotate the blades and the rotor, and the rotation of the rotor is used to drive the electric generator to produce additional electric power; and (d) providing waste heat to carbon dioxide capturing system unit and receiving the low temperature waste heat released by the carbon dioxide capturing system unit via an integrated and synergistic system with the carbon dioxide capturing unit and waste-heat recovery system unit, wherein the waste heat recovery system unit is configured to provide waste heat to the carbon dioxide capturing system unit to power the unit by waste heat and improve performance, and to receive the low temperature waste heat released by the carbon dioxide capturing system unit to improve the overall efficiency and performance of the waste heat recovery system unit;

wherein the waste heat recovery system is synergistically integrated and co-functioning with carbon dioxide capturing and electrical energy producing system units in harmony to collect waste heat released from the system, to generate electrical power, and to provide and collect waste heat to and from the carbon dioxide capturing system unit.

17. The system of claim 1, wherein the non-ionized hydrogen gas turbine system unit further comprises a gas combustion stabilization process for maintaining a uniform combustion temperature and optimal burn rate of hydrogen gas within the combustion chamber, wherein the gas combustion stabilization process comprises:

i. continuously monitoring a combustion temperature and a pressure within the combustion chamber and the gas turbine using a temperature sensor and a pressure sensor, respectively;

ii. providing feedback control from the temperature sensor and the pressure sensor to an automatic hydrogen gas flow controller for adjusting a flow rate of hydrogen gas into the combustion chamber;

iii. proportionally controlling the automatic hydrogen gas flow controller to maintain a direct proportional relationship between the hydrogen gas flow rate, burning rate, combustion temperature, and gas turbine pressure;
iv. dynamically adjusting the burn rate of the hydrogen gases by controlling the flow rate of hydrogen gas using the automatic hydrogen gas flow controller to achieve a desired gas-flame temperature;
v. regulating the hydrogen gas burn-rate within a range of 42 cm/sec to 325 cm/sec;
vi. adjusting the combustion temperature from 1000 to 5000 degrees centigrade, wherein the combustion temperature is fixed at an appropriate level for the combustion turbine to ensure that the gas flame-temperature remains constant with the constant gas flow-rate of the combustion gases; and
vii. an alternative embodiment comprising a gas mixing regulator for controlling the burning rate of hydrogen in the combustion chamber by mixing oxygen gas with non-combustible ambient gases and supplying the resulting mixed gases to the combustion chamber, wherein the gas mixing regulator operates in conjunction with the temperature sensor, pressure sensor, and automatic hydrogen gas flow controller to provide a uniform gas mixture to the combustion chamber and regulate the hydrogen burning rate.

18. The system of claim 1, wherein the non-ionized hydrogen gas turbine unit further comprises:
a) a gas mixing regulator and flame temperature adjuster integrated with an automatic hydrogen gas flow controller, a temperature sensor, and a pressure sensor for forming a regulating system that ensures a uniform combustion temperature; and
b) a gas combustion stabilization process for dynamically adjusting the burn-rate of the hydrogen gases to achieve the desired gas-flame temperature for the hydrogen gas turbine, and waste-heat based carbon dioxide absorber and regeneration parts.

19. The system of claim 1, wherein the non-ionized hydrogen gas turbine unit is optimized for maximum energy release and minimal waste through precise control of hydrogen and oxygen gas flow rates and the mixture composition, and at least further comprising:
a) integrated heat recovery systems for capturing surplus heat generated during the combustion process and harnessing this excess heat to preheat incoming gases and generate steam for supplementary power generation, wherein the exhausted waste heat plays a crucial role in powering the carbon dioxide absorption and regeneration parts of the carbon dioxide capturing system unit; and
b) a compressor and a turbine, each having a design optimized to minimize energy losses and maximize power output, wherein the optimization is achieved through advanced aerodynamic principles including computational fluid dynamics modeling and materials selection, wherein the materials selection is based on factors including but not limited to strength, weight, and thermal properties, and wherein the compressor and turbine are configured to operate in a range of operating conditions to maximize efficiency and power output.

20. The system of claim 1, wherein the carbon dioxide capturing system unit is configured to capture carbon dioxide from various sources including, but not limited to:
a) flue gases emitted from various industrial emissions, comprising: i) power generation facilities, including but not limited to coal-fired, natural gas, and biogas power plants; ii) heavy industry such as cement factories, steel and iron production, oil refining, fertilizer, aluminum production, and chemical production facilities; and iii) small and large-scale industrial manufacturing facilities;
b) directly from atmospheric air; and
c) residential complexes;
wherein the carbon dioxide capturing system unit is configured to utilize waste heat released from the non-ionized hydrogen gas turbine system unit and engineered to function efficiently using exhausted waste heat for the carbon dioxide preheating, absorption, and regeneration processes, and is configured to replace electric heaters and hydrocarbon-based heaters with the innovative waste heat-based carbon dioxide pre-heater sub-unit, carbon dioxide absorber sub-unit, and carbon dioxide regeneration sub-unit, thereby significantly reducing electric energy consumption and hydrocarbon consumption and configured to reduce overall energy consumption and carbon emissions;
wherein the carbon dioxide capturing system unit is configured to increase the net power output and overall efficiency of power generation plants by: i) capturing carbon dioxide emissions using waste heat and clean energy, and ii) reducing energy requirements for carbon capture compared to conventional methods, and increasing the overall system efficiency of the power plants;
wherein the carbon dioxide capturing system unit is configured for use in heavy industries and industrial manufacturing facilities to: i) capture carbon dioxide emissions utilizing waste heat and clean energy, ii) reduce energy requirements for carbon capture in heavy industries and industrial manufacturing facilities compared to conventional methods, and iii) increase the overall sustainability and efficiency of the facilities;
wherein the heat exchanger system of the carbon dioxide pre-heater sub-unit, the carbon dioxide absorber sub-unit, and the carbon dioxide regeneration sub-unit encompass a variety of heat configuration types comprising fluidized-bed heater, rotary-kiln heater, belt-conveyor heater, screw-conveyor heater, shell and tube heat exchanger, fluid-bed dryer heater, and indirect-heat exchanger heater, and wherein the heat exchanger system is constructed using materials selected for their high resistance to thermal cycling, corrosion, and mechanical stress, ensuring the long-term durability and stability of the system during operation in harsh thermal and environmental conditions;
wherein the heat exchanger system further comprises at least a plurality of heat transfer surfaces arranged to maximize thermal contact area and facilitate enhanced heat transfer between the carbon dioxide capturing mediums and the working fluid, wherein the heat transfer surfaces are engineered to withstand low and high thermal loads and corrosive environments to adapt to different heat transfer conditions and different industrial carbon capture applications;
wherein the working fluid carries heat energy and circulates through the heat exchanger system to facilitate the carbon dioxide-capturing process;
wherein the working fluid includes, but is not limited to, water, steam, and organic solvents; wherein the system is configured to allow for the interchangeability of the working fluid to adapt to different heat transfer conditions and applications; and wherein the fluid circulation system is further equipped with a variable-speed pump system capable of adjusting the working fluid flow rate in response to real-time thermal demand and system pressure variations;

wherein the heat exchanger system utilizes waste heat energy released from at least the non-ionized hydrogen gas turbine system unit, and the heat exchanger system is synergistically operating with at least;

a) the waste heat recovery system unit; the system is configured to receive waste heat energy and generate electric power via a steam turbine while simultaneously providing and regulating energy for the heat exchanger system, wherein the heat exchanger system is configured to receive heat energy fluid, and wherein the system is configured to transfer heat energy to the carbon capture mediums within the heat exchanger system during the carbon dioxide absorption and regeneration process, wherein the heat exchanger system is constructed of at least one good thermal conductivity material to optimize heat transfer efficiency;

b) fluid circulation system; the system is operably coupled to the variable speed pumps, configured to circulate the working fluid through the heat exchanger system, wherein the fluid circulation system is adapted to adjust the fluid flow rate in response to varying temperature and pressure conditions within the heat exchanger system;

c) automatic thermal management subsystem; the subsystem is configured to regulate and optimize the flow of the working fluid to the heat exchanger system and to control the heat transfer process based on real-time data and specific heat energy requirements of the carbon dioxide capturing medium, wherein the automatic thermal management subsystem is adapted to adjust parameters such as flow rate, pressure, and temperature to efficiently operate the carbon capturing process and the efficient waste heat utilization; and d) variable speed pumps, variable valves, and sensors are configured to provide working fluid into the heat exchanger system and operate heat circulation and heat load adjustment processes, wherein the pumps, variable valves, and sensors synergistically work with at least the waste heat recovery system unit, automatic thermal management subsystem and solvents/sorbents/adsorbents rejuvenation subsystem;

wherein the automatic thermal management subsystem is integrated at least with the waste heat recovery system unit, non-ionized hydrogen gas turbine system unit, and carbon dioxide capturing system unit, wherein the automatic thermal management subsystem is configured to monitor, assess, and dynamically optimize the heat transfer process in real-time based on sensor inputs and process monitoring data, to maintain system stability, reduce heat energy losses, and improve efficiency;

wherein the automatic thermal management subsystem controls and manages the heat exchanger system operations, and the system is at least configured to i) manage and operate the waste heat flow, and ii) operate safety features, and wherein the safety features comprise pressure relief valves, thermal expansion compensators, and automatic shutdown mechanisms, designed to protect the system and its components from overpressurization, excessive thermal loads, and potential failure modes;

wherein the automatic thermal management subsystem and the solvents/sorbents/adsorbents rejuvenation subsystem are configured to operate synergistically and are configured at least to control, manage, and automate the overall carbon capturing process, the heat exchanger operations, and the waste heat supply process;

wherein the waste heat energy released during the carbon dioxide regeneration process is collected and recovered for further energy utilization and to improve overall efficiency;

wherein the heat exchanger system is configured to operate within a temperature range determined by the thermal properties, chemical stability, and operational requirements of the carbon dioxide preheater, carbon dioxide absorber, and carbon dioxide regeneration sub-units, wherein the temperature range is further adjusted based on the thermal tolerance, size, and chemical composition of the carbon capturing medium, and wherein the heat exchanger system incorporates adaptive temperature control mechanisms to maintain operational efficiency across varying system conditions;

wherein the heat exchanger system is further constructed from advanced thermal conductor materials selected for their higher thermal conductivity, and corrosion resistance, and configured to increase the thermal conductivity, reduce heat energy losses, and increase the overall efficiencies of the waste heat utilization;

wherein the heat exchanger system of the carbon dioxide absorber sub-unit and the carbon dioxide regeneration sub-unit comprises diverse designs, sizes, and structures, different carbon capture mediums, operates at different thermal loads, and is configured for easy applicability and adaptability in various industrial carbon capture applications; and wherein the heat exchanger system is adaptable and configurable to various carbon capture components, including but not limited to: i) stripper towers with adjustable heights, diameters, and thermal loads to optimize the regeneration of carbon dioxide; ii) reboilers, condensers, and heat recovery units with varying thermal capacities and configurations designed to maximize heat transfer efficiency and minimize energy loss; iii) absorber columns, scrubbers, and reactors capable of operating under different pressure, temperature, and flow conditions for effective carbon dioxide absorption and removal; and iv) compressors, pumps, and valves engineered to handle specific flow rates, pressures, and temperatures for seamless system operation, wherein the heat exchanger system comprises multi-channel or multi-layer heat exchanger structures to ensure efficient heat transfer from waste heat streams of varying temperatures and flow rates.

* * * * *